(12) United States Patent
Zhu et al.

(10) Patent No.: US 11,923,847 B2
(45) Date of Patent: Mar. 5, 2024

(54) METHOD AND SYSTEM FOR PROVIDING WIRELESS FPGA PROGRAMMING DOWNLOAD VIA A WIRELESS COMMUNICATION BLOCK

(71) Applicant: GOWIN Semiconductor Corporation, GuangZhou (CN)

(72) Inventors: Jinghui Zhu, San Jose, CA (US); Jiyong Zhang, Jinan (CN); Jianhua Liu, Fremont, CA (US)

(73) Assignee: GOWIN SEMICONDUCTOR CORPORATION, Guangzhou (CN)

( * ) Notice: Subject to any disclaimer, the term of this patent is extended or adjusted under 35 U.S.C. 154(b) by 0 days.

(21) Appl. No.: 17/225,001

(22) Filed: Apr. 7, 2021

(65) Prior Publication Data

US 2021/0226633 A1 Jul. 22, 2021

Related U.S. Application Data

(63) Continuation of application No. 16/681,376, filed on Nov. 12, 2019, now Pat. No. 10,992,298, which is a continuation-in-part of application No. 16/657,998, filed on Oct. 18, 2019, now Pat. No. 10,833,722.

(51) Int. Cl.
*G01R 31/3185* (2006.01)
*G01R 31/302* (2006.01)
*H03K 19/17728* (2020.01)
*H03K 19/17758* (2020.01)

(52) U.S. Cl.
CPC ... *H03K 19/17758* (2020.01); *G01R 31/3025* (2013.01); *G01R 31/318519* (2013.01); *G01R 31/318597* (2013.01); *H03K 19/17728* (2013.01)

(58) Field of Classification Search
CPC .... H04W 72/042; H04L 5/0053; G06F 21/76; H03K 19/17758; H03K 19/17728; G01R 31/3025; G01R 31/318519; G01R 31/318597
USPC .......................................... 375/219
See application file for complete search history.

(56) References Cited

U.S. PATENT DOCUMENTS

| | | | |
|---|---|---|---|
| 7,111,272 B1 * | 9/2006 | Sun | ............. H03K 19/17728 716/117 |
| 9,699,653 B2 * | 7/2017 | MacDuff | ............. H04W 76/30 |
| 2002/0173298 A1 | 11/2002 | Elayda et al. | |
| 2004/0033079 A1 | 2/2004 | Sheth et al. | |
| 2005/0073389 A1 | 4/2005 | Chandley | |

(Continued)

*Primary Examiner* — Syed Haider
(74) *Attorney, Agent, or Firm* — JW Law Group; James M. Wu

(57) ABSTRACT

A programmable semiconductor device contains a wireless communication block ("WCB") capable of facilitating wirelessly field programmable gate array ("FPGA") programming download as well as functional logic implementation. In one aspect, WCB detects an FPGA access request for initiating an FPGA reconfiguration from a remote system via a wireless communications network. Upon receiving a configuration bitstream for programming the FPGA via the wireless communications network, the configuration bitstream is forwarded from WCB to a configuration download block ("CDB") for initiating a configuration process. CDB subsequently programs at least a portion of configurable logic blocks ("LBs") in FPGA in response to the configuration bitstream.

21 Claims, 14 Drawing Sheets

(56) References Cited

U.S. PATENT DOCUMENTS

| | | | |
|---|---|---|---|
| 2013/0023106 A1* | 1/2013 | Pickett | G11C 13/0007 |
| | | | 710/305 |
| 2015/0100793 A1 | 4/2015 | Newell | |
| 2017/0195173 A1 | 7/2017 | Izenberg et al. | |
| 2021/0064463 A1* | 3/2021 | Suh | G06F 11/1068 |

* cited by examiner

METHOD AND SYSTEM FOR PROVIDING WIRELESS FPGA PROGRAMMING DOWNLOAD VIA A WIRELESS COMMUNICATION BLOCK

PRIORITY

This application is a continuation of a U.S. patent application having an application Ser. No. 16/681,376, filed on Nov. 12, 2019 and entitled "Method and System for Providing Wireless FPGA Programming Download via A Wireless Communication Block," issued with a U.S. Pat. No. 10,992,298 on Apr. 27, 2021, which is a continuation-in-part of U.S. patent application Ser. No. 16/657,998, filed on Oct. 18, 2019 and entitled "Method and Apparatus for Providing a Programmable Logic Device Having a Configurable Wireless Communication Block," issued with a U.S. Pat. No. 10,833,722 on Nov. 10, 2020.

All mentioned U.S. applications and/or patents are hereby incorporated by reference.

FIELD

The exemplary embodiment(s) of the present invention relates to the field of programmable semiconductor devices for computer hardware and software. More specifically, the exemplary embodiment(s) of the present invention relates to wireless communication capabilities in a field-programmable gate array ("FPGA") or programmable logic device ("PLD").

BACKGROUND

With increasing popularity of digital communication, artificial intelligence (AI), IoT (Internet of Things), and/or robotic controls, the demand for faster and efficient hardware and semiconductors with processing capabilities is constantly in demand. To meet such demand, high-speed and flexible semiconductor chips are generally more desirable. Once conventional approach to satisfy such demand is to use dedicated custom integrated circuits and/or application-specific integrated circuits ("ASICs") to fulfil such needs. A shortcoming with ASIC approach is that it lacks flexibility while consumes a large number of resources.

An alternative conventional approach, which enjoys the growing popularity, is utilizing programmable semiconductor devices ("PSDs") such as programmable logic devices ("PLDs") or field programmable gate arrays ("FPGAs"). A feature of PSD is that it allows an end user to program one or more desirable functions to suit his/her applications. To use PSD, FPGA or PLD has to be configured or programmed before use. A traditional approach to configure an FPGA is to use FPGA programming download circuit which communicates with a personal computer or host through the USB interface to transmit a desirable configuration file such as a bitstream or bitstream file(s) from the host to FPGA for configuration. For example, the bitstream can be downloaded via a JTAG interface and the bitstream is used to program an FPGA to perform user specified function(s).

However, a drawback associated with a conventional configuration approach to FPGA or PLD is that such configuration/programming FPGA or PLD typically relies on a host system connected to FPGA or PLD for programming and/or reprogramming the configurable logic in the PSD.

SUMMARY

On embodiment of the presently claimed invention discloses a semiconductor device containing a wireless accessible PLD ("WAP") capable of being wirelessly programmed to perform logic functions via one or more remote systems. The WAP, in one embodiment, includes a wireless communication block ("WCB") and a field programmable gate array ("FPGA"). WCB, in one aspect, is used to facilitate wirelessly downloading FPGA configuration files or bitstreams for configuring FPGA. WCB is also used to facilitate wirelessly accessing the functional logic of FPGA. In one aspect, WCB is able to detect an FPGA access request for initiating an FPGA reconfiguration from a remote system via a wireless communications network. Upon receiving a configuration bitstream via the wireless communications network, the configuration bitstream is forwarded from WCB to a configuration download block ("CDB") for initiating a configuration process. CDB subsequently programs at least a portion of configurable logic blocks ("LBs") in FPGA in response to the configuration bitstream.

Additional features and benefits of the exemplary embodiment(s) of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1A:
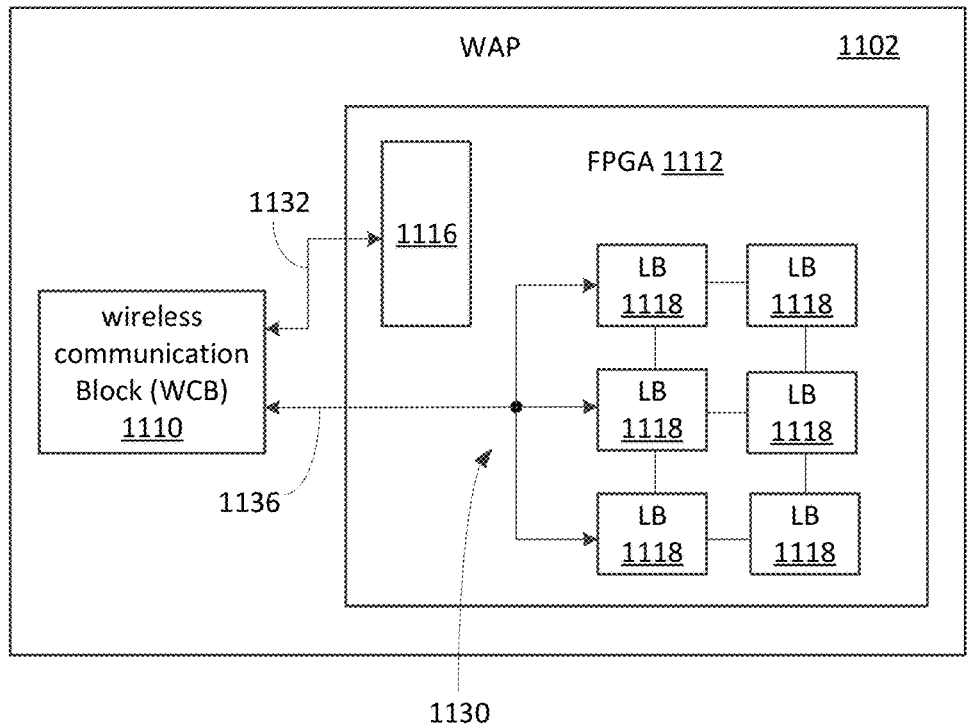
FIGS. 1A-1B are block diagrams illustrating a wireless accessible PLD ("WAP") capable of providing wireless FPGA programming download and debugging using one or more WCBs in accordance with one embodiment of the present invention.

Embodiments of the present invention disclose a method(s) and/or apparatus for providing a wireless accessible PLD able to provide communication between FPGA and remote systems via a wireless communication network.

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be understood that such a development effort might be complex and time-consuming but would nevertheless be a routine undertaking of engineering for those of ordinary skills in the art having the benefit of embodiment(s) of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

In accordance with the embodiment(s) of present invention, the components, process steps, and/or data structures described herein may be implemented using various types of operating systems, computing platforms, computer programs, and/or general-purpose machines. In addition, those of ordinary skills in the art will recognize that devices of a less general-purpose nature, such as hardware devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory.

The term "system" or "device" is used generically herein to describe any number of components, elements, subsystems, devices, packet switch elements, packet switches, access switches, routers, networks, computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

Embodiments of the present invention disclose a PSD having a WCB and configurable LBs of FPGA capable of facilitating wireless bitstream download for configuring and debugging LBs. PSD containing WCB and LBs is also known as a wireless accessible PLD ("WAP") capable of operating in a programming mode or a logic access mode. During the programming mode, WAP wirelessly downloads netlist(s) or updated configuration bitstream from a remote system via a wireless communications network for FPGA configuration. For example, WAP, via WCB, detects an FPGA access request for initiating an FPGA reconfiguration via a wireless communications network. Upon receiving a configuration bitstream for programming FPGA, WCB passes the configuration bitstream to CDB for initiating a configuration process. CDB subsequently reprograms or reconfigures at least a portion of configurable LBs in FPGA based on the configuration bitstream. It should be noted that the configuration bitstream contains user desirable logic functions.

For the logic access mode, WAP allows a user or a user system to wirelessly access programmed FPGA logic functions. For instance, a user can remotely provide an input to a logic function of FPGA via a wireless communications network. The logic function of FPGA generates a result based on the input as well as previously stored data, and the result is subsequently transmitted to the user via WCB through a wireless communications network.

FIG. 1A is a block diagram illustrating a WAP 1102 capable of facilitating wireless download for programming FPGA or debugging in accordance with one embodiment of the present invention. It should be noted that the terms "FPGA" and "PLD" are referring to the same or similar configurable logic device that can be programmed to perform user desirable functions after fabrication. WAP 1102 includes WCB 1110 and FPGA 1112 which is also known as FPGA die, PLD die, FPGA chip, or PLD chip. FPGA 1112 further includes CDB 1116 and configurable LBs 1118 wherein configurable LBs 1118 can be programmed or configured by bitstream(s), bitstream file(s), or configuration bitstream(s) to perform specific logic function(s). It should be noted that the underlying concept of the exemplary embodiment(s) of the present invention would not change if one or more blocks (circuit or elements) were added to or removed from FIG. 1A.

WCB 1110, in one aspect, is a circuit or component configured to provide or facilitate wireless communication between FPGA 1112 and an external remote system. For example, a function of WCB is to provide a wireless communication able to transmit or receive information between WAP 1102 and an external remote system via a wireless communication network. The wireless communications network includes, but not limited to, Wi-Fi, Bluetooth, cellular, satellite, and/or radio networks. WCB 1110 can be a circuit fabricated within an FPGA. Alternatively, WCB 1110 can be placed in a semiconductor die or chip which can be packaged together with FPGA on a module or package.

FPGA 1112 is a semiconductor integrated circuit ("IC") or die containing various configurable LBs as well as memory cells capable of being programmed by a user after the IC is fabricated. To program or configure an FPGA to perform a user defined logic function, a set of bitstreams may be used to program the FPGA to perform user desirable functions. In one example, FPGA includes arrays of configurable LBs and routing fabric wherein the routing fabric as indicated by numeral 1130 further contains various reconfigurable interconnects used to connect various LBs.

WAP 1102, in one example, is a module containing an FPGA 1112 and WCB 1110 for facilitating wireless bitstream download for programming FPGA as well as debugging FPGA. WCB 1110, in one example, is coupled to CDB 1116 via connection 1132 for facilitating operation of the programming mode. Similarly, WCB 1110 connects to LBs via connection 1136 for facilitating operation of the logic access mode. Depending on the applications, connections 1132-1136 can be merged into one connection. WAP 1102, in another example, includes a wireless module such as WCB 1110 and an FPGA die such as FPGA 1112 wherein WCB 1110 and FPGA 1112 are packaged onto a single package.

In an alternative embodiment, an IC is fabricated or manufactured to contain a PSD such as WAP 1102 configured to have a wireless block and an FPGA block. WAP 1102 includes a set of configurable LBs 1118, routing fabric 1130, CDB 1116, and WCB 1110, wherein configurable LBs 1118 are able to be selectively programmed to perform one or more logic functions. Routing fabric 1130 is configured to selectively route information between configurable LBs 1118 and input/output ports based on a routing configuration bitstream or configuration signals. CDB 1116 includes a memory which is used to store configuration data such as bitstream for programming configurable LBs 1118 as well as routing fabric 1130.

WCB 1110 is operable to facilitate wireless programming or wireless debugging configurable LBs 1118 via a wireless communications network. In one example, WCB 1110 includes a Wi-Fi transmitter and a Wi-Fi receiver. Alternatively, WCB 1110 includes a cellular transmitter and a cellular receiver. WCB 1110 can also include a Bluetooth transmitter and a Bluetooth receiver. Depending on the applications, WCB 1110 may be configured to select one or more built-in selectable Wi-Fi transceiver and Bluetooth transceiver.

It should be noted that WAP 1102 provides an FPGA wireless programming download/debug circuit system containing a wireless module such as WCB 1110 and an FPGA module such as LBs 1118. The wireless module, connected with CDB 1116, is used to implement a configuration mode. In one aspect, the wireless module connected to the FPGA logic resource are used to realize the user mode. It should be noted that the two modes can be dynamically switched based on the control signals.

One advantage of using a PSD having a wireless block such as WAP 1102 is that it is able to provide a wireless program downloading/debugging a PSD such as an FPGA without a physically connected host system.

Figure 1B:
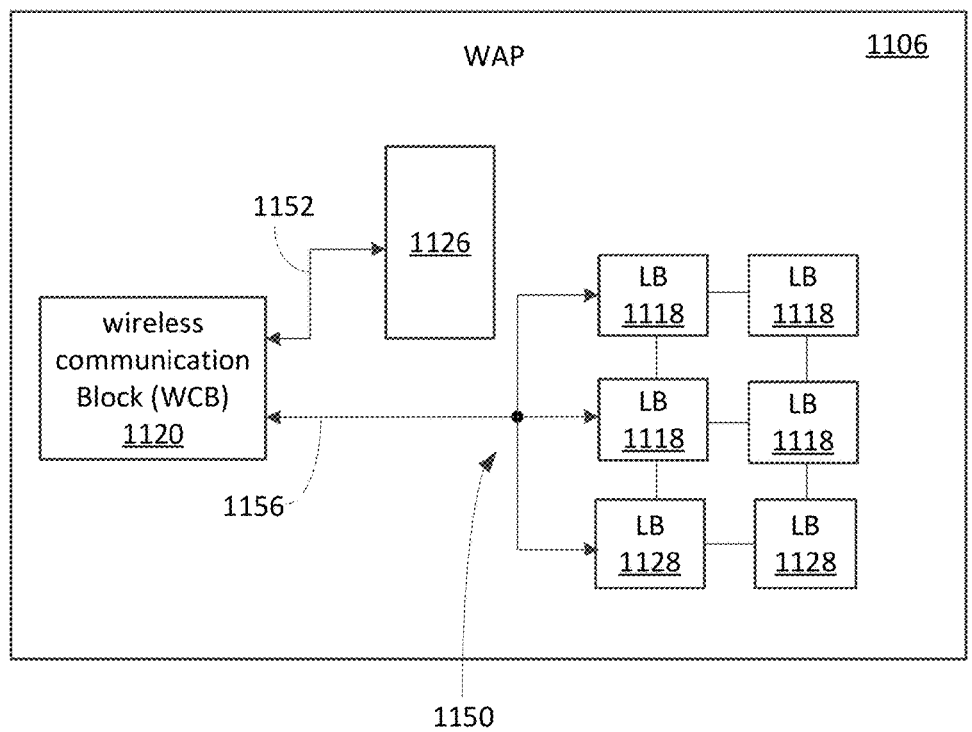

FIG. 1B is a block diagram illustrating an IC or semiconductor chip containing a WAP 1106 capable of facilitating wireless FPGA programming download and/or debugging in accordance with one embodiment of the present invention. WAP 1106 includes WCB 1120, CDB 1126, and configurable LBs 1128 wherein configurable LBs 1128 are programmed or configured by configuration bitstream(s) to perform configured logic function(s). WAP 1106, in one aspect, is similar to WAP 1102 shown in FIG. 1A except that WCB 1120, CDB 1126, and LBs 1128 are fabricated on a single IC or chip. It should be noted that the underlying concept of the exemplary embodiment(s) of the present invention would not change if one or more blocks (circuit or elements) were added to or removed from FIG. 1B.

WAP 1106, in one embodiment, is an FPGA wireless programming download/debug circuit capable of wirelessly communicating with a device using wireless transmission through WCB 1120 or wireless module. Since WCB 1120, CDB 1126, and LBs 1128 are placed or fabricated on a single IC, die, and/or chip, the layout of WAP 1106 improves circuit integration whereby reducing resource allocation as well as enhancing efficiency. In one embodiment, WAP 1106 is configured to have a programming (or configuration) mode and a user mode (or logic access mode).

WCB 1120, in one embodiment, facilitates wireless data transmission between WAP 1106 and an external remote system, not shown in FIG. 1B. The data transmission includes configuration bitstream for programming/reprogramming FPGA. The data transmission also includes input data from the remote system to WAP 1106 or output data from WAP 1106 to the remote system.

When the programming mode is activated, WCB 1120 downloads netlist or updated configuration bitstream from a remote system via a wireless communications network. The bitstream, also known as bitstream file, is forwarded from WCB 1120 to CDB 1126 via connection 1152. At least a portion of LBs 1128 is subsequently programmed or reconfigured by CDB 1126 based on the bitstream. When the logic access mode is active, WAP allows a user or user system to wirelessly access programmed FPGA logic functions. For instance, a user can remotely provide an input to a logic function of FPGA via WCB 1120 using connection 1156 and/or routing fabric 1150. The result generated by the logic function of FPGA or LBs 1128 is subsequently transmitted to the user via WCB 1120. Depending on the applications, connections 1150-1156 can be merged into one configurable fabric.

One advantage of using WAP 1106 is to increase integration and save design costs while improving resource utilization.

Figure 2A:
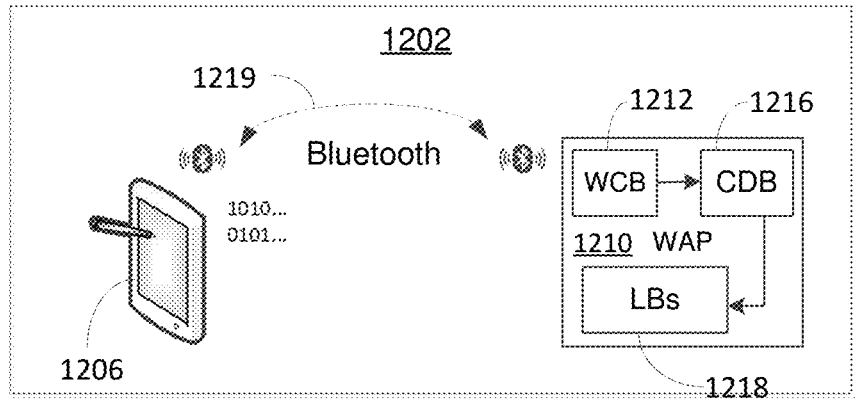
FIGS. 2A-2B are block diagrams illustrating a wireless accessible PLD ("WAP") capable of facilitating wireless FPGA programming and debugging in accordance with one embodiment of the present invention.

FIG. 2A is a block diagram 1202 showing an exemplary illustration of wireless downloading bitstream via a Bluetooth wireless network for configuring and/or debugging an FPGA in accordance with one embodiment of the present invention. Diagram 1202, in one embodiment, includes a portable device 1206, WAP 1210, and a wireless network 1219 wherein the wireless network is a Bluetooth communications network. It should be noted that the underlying concept of the exemplary embodiment(s) of the present invention would not change if one or more blocks (circuit or elements) were added to or removed from diagram 1202.

WAP 1210, which is similar WAP 1102 as shown in FIG. 1A, includes WCB 1212, CDB 1216, and configurable LBs 1218. Configurable LBs 1218 can be programmed or configured by bitstream(s) to perform specific configured logic function(s). WAP 1210 can be configured to operate two modes, namely programming mode and logic access mode.

Portable device 1202, in one example, can be a smart phone, tablet computer, laptop computer, desktop computer, server, workstation, base station, and the like. Portable device 1206, in one aspect, is a remote system coupled to WAP 1210 via a wireless network 1219. In one aspect, wireless network is a Bluetooth network 1219.

In one aspect, WAP 1210 containing an FPGA programming download circuit is able to wirelessly communicate with devices, such as workstations, personal computers, or portable device 1206 over a network. For example, after downloading the bitstream files from portable device 1206 to WCB 1212 via Bluetooth network 1219, at least a portion of LBs 1218 is programmed or configured by CDB 1216 based on the bitstream or bitstream file(s).

WAP 1210 can also facilitate sending a request or input data from portable device 1206 to the programmed logic functions operated by LBs 1218 via Bluetooth network 1219. Upon generating a result by the programmed logic functions based on the request or input data, the result can be sent from WAP 1210 to portable device 1206 via Bluetooth network 1219. It should be noted that WCB 1212 can also be used to provide power management for WAP 1210.

An advantage of using WAP 1210 is to allow a user to access FPGA remotely without wire connections. Using built-in wireless transceiver also simplifies FPGA design and reduces the printed circuit board ("PCB") area whereby enhances overall device efficiency.

Figure 2B:
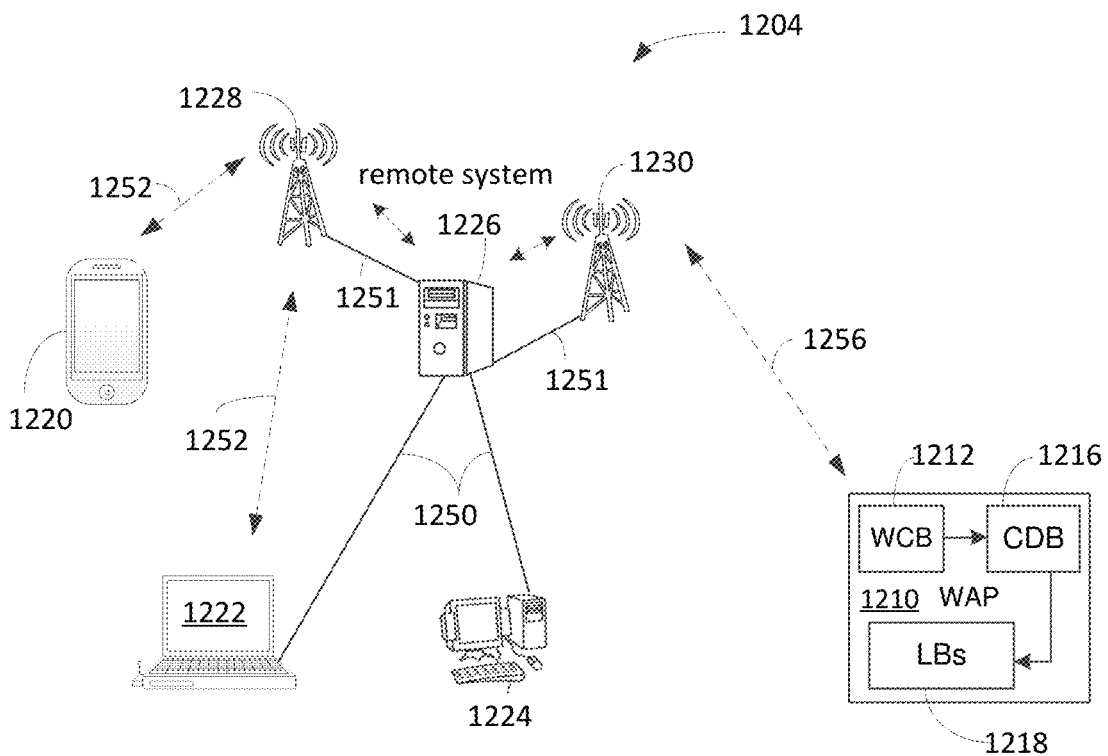

FIG. 2B is a block diagram 1204 illustrating a remote wireless system used to facilitate wireless downloading of configuration bitstream between remotely situated WAPs and users in accordance with one embodiment of the present invention. Diagram 1204 includes WAP 2110, remote system 1226, and user devices 1220-1224. It should be noted that the underlying concept of the exemplary embodiment(s) of the present invention would not change if one or more blocks (circuit or elements) were added to or removed from diagram 1204.

While user devices 1220-1224 are coupled to remote system 1226 via wired connections 1250 and wireless connections 1252, remote system 1226 is coupled to WAP 1210 via a wireless network 1256. In one aspect, remote system 1226 is a proprietary system operated by a special company such as GOWIN Semiconductor™ to facilitate wireless access between user systems 1220-1224 and WAP 1210. In one example, remote system 1226 is able to communicate to base station or tower 1228-1230 via either its built-in wireless capabilities or connections 1251. It should be noted that remote system 1226 can implement an authentication process to determine whether any of the user systems such as user device 1220 is allowed to access or reprogram LBs 1218.

Figure 3A:
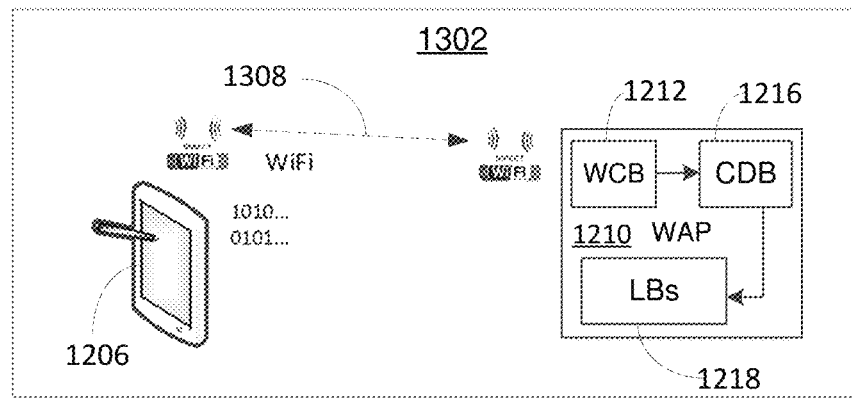
FIGS. 3A-3C are block diagrams illustrating a wireless FPGA downloading and wireless access of logic functions using one or more WCBs in accordance with one embodiment of the present invention.

FIG. 3A is a block diagram 1302 showing an exemplary illustration of wireless downloading bitstream via a WiFi wireless network for facilitating configuring and/or debugging an FPGA in accordance with one embodiment of the present invention. Diagram 1302 includes a portable device 1206, WAP 1210, and a wireless network wherein the wireless network is a Wi-Fi communications network. It should be noted that the underlying concept of the exemplary embodiment(s) of the present invention would not change if one or more blocks (circuit or elements) were added to or removed from diagram 1302.

WAP 1210 containing an FPGA programming download circuit such as WCB 1212 is able to communicate with devices, such as workstations, personal computers, or portable device 1206 via a Wi-Fi network 1308. For example, after transmitting a set of bitstream files from portable device 1206 to WCB 1212 via Wi-Fi network 1308, at least a portion of LBs 1218 is programmed or configured by CDB 1216 based on the bitstream or bitstream file(s). It should be noted that WCB can also be configured to implement an authentication process to determine whether portable device 1206 is allowed to reprogram LBs 1218.

It should be noted that the programming download or debugging circuitry uses its wireless capabilities to communicate with devices or user devices using wireless transmission. The device or user device may include mobile phones, computers, tablets, automobiles, watches, and the like. For instance, after completing a logic design for performing a specific logic function, the user communicates with the wireless module such as WCB 1212 through a wireless transmission protocol such as Bluetooth or WiFi Direct for transmitting the bitstream file which represents the logic design. The wireless module such as WCB 1212 is able to identify the wireless transmission protocol and receive the bitstream file accordingly. After transmitting the received bitstream file to CDB 1216, at least a portion of LBs in FPGA is mapped or configured based on the downloaded bitstream file. After completing, WAP 1210, for example, is capable of performing the specific logic function as the user designed.

To verify a programmed logic function, WAP 1210, in one embodiment, employs a wireless programming download/debug circuit capable of verifying as well as debugging the desirable logic function(s). For instance, the wireless module such as WCB 1212 can interact with the user via a display terminal or dashboard through a wireless network.

One advantage of using WAP 1210 is that WAP 1210 allows a user to remotely reprogram, verify, debug, as well as use the user designed logic via a wireless communications network.

Figure 3B:
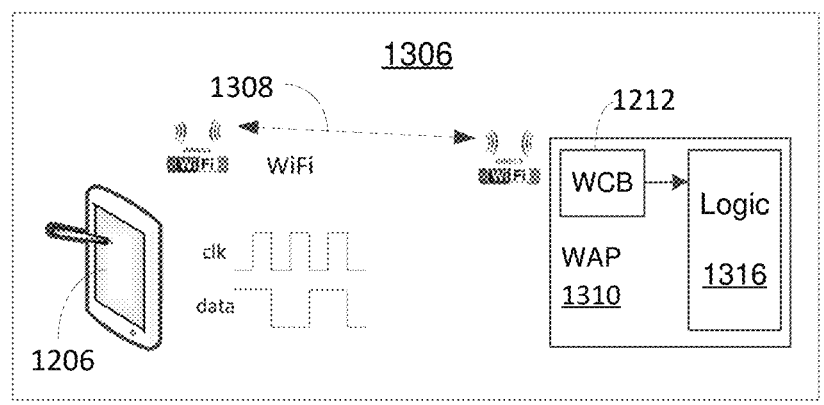

FIG. 3B is a block diagram 1306 showing an exemplary illustration of wireless access of logic functions of FPGA using a Wi-Fi wireless network in accordance with one embodiment of the present invention. Diagram 1306, which is similar to diagram 1302 shown in FIG. 3A, includes a portable device 1206, WAP 1310, and a Wi-Fi communications network 1308. In one embodiment, the CDB is not required when WAP 1310 is in the logic access mode. It should be noted that the underlying concept of the exemplary embodiment(s) of the present invention would not change if one or more blocks (circuit or elements) were added to or removed from diagram 1306.

WAP 1310, in one embodiment, is capable of facilitating access to the programmed logic functions in the FPGA portion of WAP 1310 as indicated by numeral 1316. For example, portable device 1206 can send a request for output data or input data from or to WCB 1212 via Wi-Fi communications network 1308. The request and/or input data is subsequently forwarded to logic block 1316 for accessing configured logic functions or LBs in logic block 1316. Upon generating a result by logic block 1316 based on the request or input data, the result is sent from WAP 1310 to portable device 1206 via Wi-Fi communication network 1306. It should be noted that WCB 1212 can also be used to provide power management for WAP 1310.

In the user mode or logic access mode, a user, for example, can use the wireless module such as WCB 1212 to complete a desirable logic function according to a set of predefined requirements. A default mode for WAP 1310, for example, can be selectively set to the configuration mode. WAP 1310 can also set the user mode as default mode after the power on. In one aspect, WCB 1212 is used to manage or switch between configuration mode and user mode.

Figure 3C:
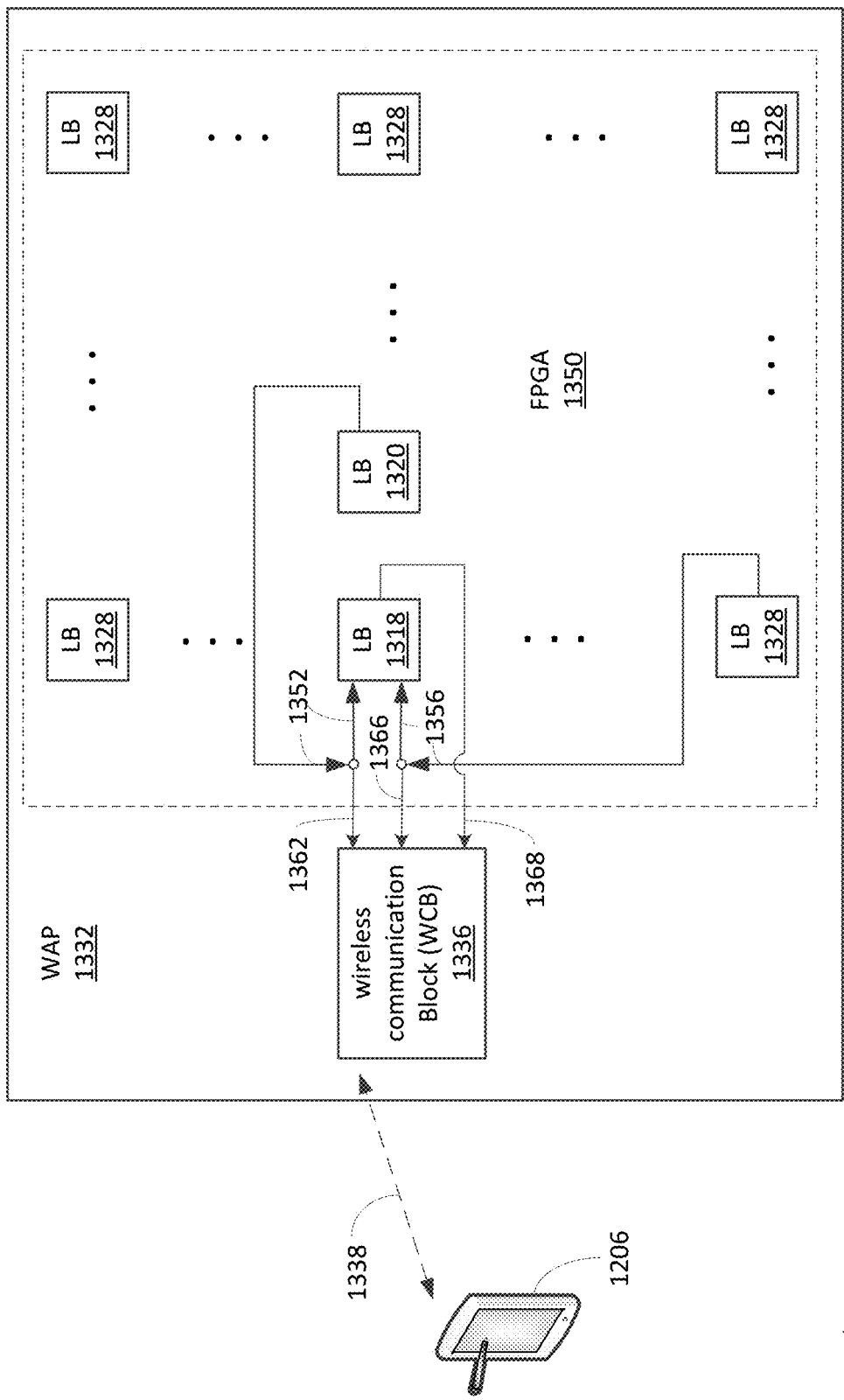

FIG. 3C is a block diagram 1330 illustrating a debugging and/or verification scenario using wireless access during a user mode in accordance with one embodiment of the present invention. Diagram 1330, which is similar to diagram 1306 shown in FIG. 3B, includes a portable device 1206, WAP 1332, and a wireless communications network 1338. In one embodiment, the CDB is not required when WCB 1336 is in the logic access mode or user mode. It should be noted that the underlying concept of the exemplary embodiment(s) of the present invention would not change if one or more blocks (circuit or elements) were added to or removed from diagram 1330.

WAP 1332 includes WCB 1336 and FPGA 1350 wherein FPGA 1350 includes various LBs 1318-1328. LBs 1318-1328 are capable of being programmed to perform a set of specific logic functions. WCB 1336 and FPGA 1350, in one embodiment, are fabricated on a single die. Alternatively, WCB 1336 and FPGA 1350 are packaged on a single module.

In one aspect, WCB 1336 is able to identify and capture input data 1352-1356 to LB 1318 as indicated by numerals 1362-1366. The captured input data 1352-1356 are subsequently forwarded from WCB 1336 to device 1206 via wireless network 1338. Upon completion of the logic function performed by LB 1318, the output 1368 is copied to WCB 1336 for verification or debugging process. The logic function can be any function, such as arithmetic logic unit (ALU), multiplier, adder, subtractor, and the like. It should be noted that LB 1318 can contain multiple programmable logical elements ("LEs") or macrocells.

In operation, a method of verifying or debugging a functional logic in FPGA 1350 via WCB 1336. When WCB 1336 receives a debugging request from a remote device such as device 1206 via a wireless communications network 1338, a first configurable LB such as LB 1318 is identified from an array of configurable LBs 1318-1328 in FPGA 1350 based on the debugging request. WCB 1336 obtains a copy of input data 1362-1366 to LB 1318 as input data 1362-1366 continues to travel to LB 1318. The copy of input data 1362-1366 are transmitted from WCB 1336 to remote device 1206 via wireless communications network 1338. After receiving an output data 1368 from LB 1318 which performs the configured logic function, output data 1368 is transmitted to remote device 1206 via the wireless communications network 1338. Upon receipt of input data 1362-1366 and output data 1368, remote device 1206 can properly verify and/or debug the functionality of LB 1318 based on the input data and output data 1362-1368.

One advantage of using WAP 1332 having a wireless capability is that it allows a user or operator to access and verify the functionality of FPGA without physically access to the FPGA.

Figure 4A:
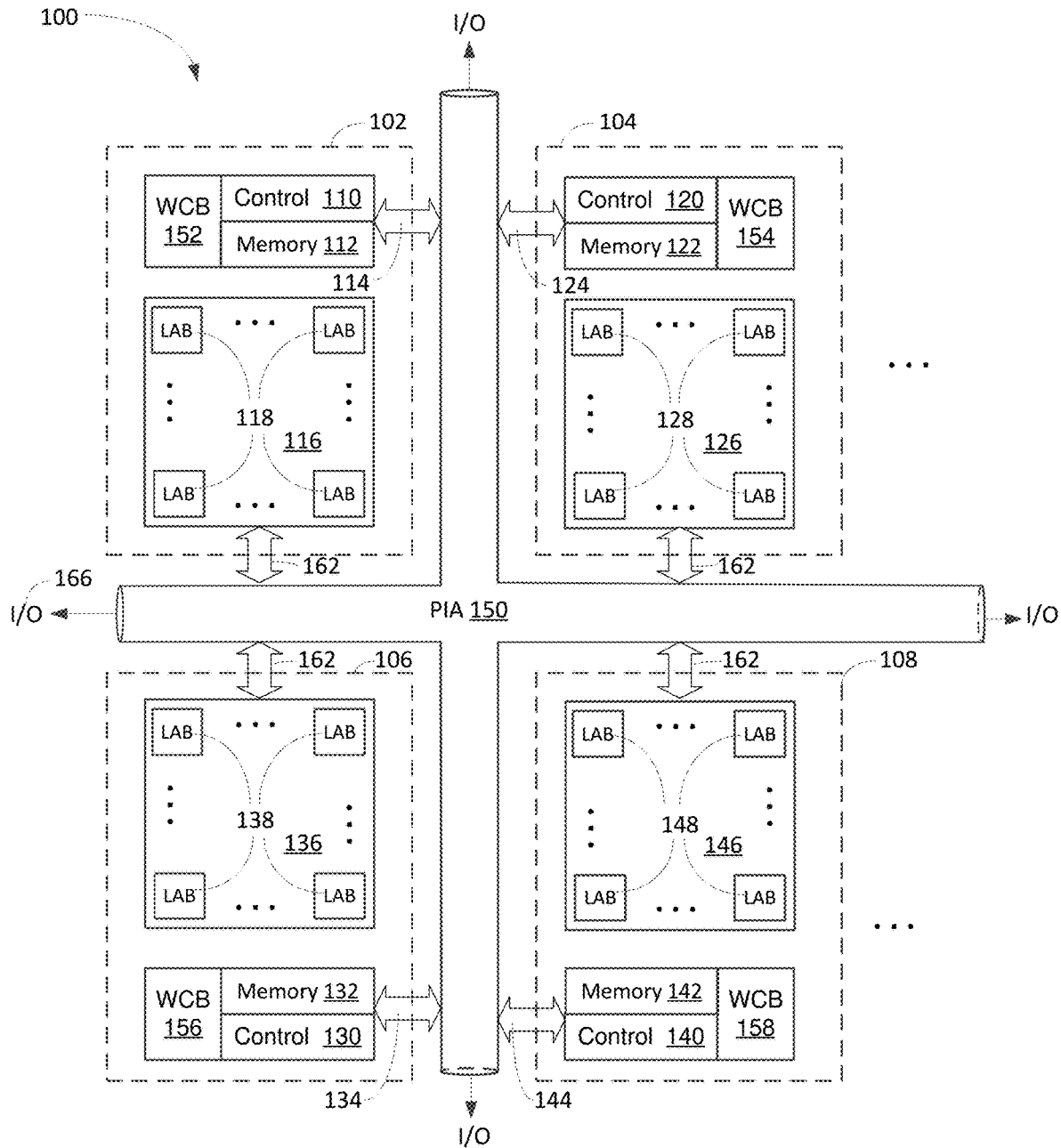
FIGS. 4A-4B are block diagrams illustrating a wireless accessible PLD ("WAP") capable of providing network communications using one or more WCBs in accordance with one embodiment of the present invention.

FIG. 4A is a block diagram 100 illustrating a wireless accessible PLD ("WAP") capable of providing network communications using one or more WCBs in accordance with one embodiment of the present invention. Diagram 100 includes multiple programmable partitioned regions ("PPR") 102-108, a programmable interconnection array ("PIA") 150, internal power distribution fabric, and regional input/output ("I/O") ports 166. PPRs 102-108 further includes control units 110, 120, 130, 140, memories 112, 122, 132, 142, configurable WCBs 152-158, and logic blocks ("LBs") 116, 126, 136, 146. Note that control units 110, 120, 130, 140 can be configured into one single control unit, and similarly, memory 112, 122, 132, 143 can also be configured into one single memory device for storing configurations. Furthermore, configurable WCBs 152-158 can also be to combined into one single programmable WCB. In one aspect, WAP is a PSD containing at least one FPGA and WCB. It should be noted that the underlying concept of the exemplary embodiment(s) of the present invention would not change if one or more blocks (circuit or elements) were added to or removed from diagram 100.

LBs 116, 126, 136, 146, include multiple LABs 118, 128, 138, 148, wherein each LAB can be further organized to include, among other circuits, a set of programmable logical elements ("LEs") or macrocells, not shown in FIG. 4A. Each LAB, in one example, may include anywhere from 32 to 512 programmable LEs. I/O pins (not shown in FIG. 4A), LABs, and LEs are linked by PIA 150 and/or other buses, such as buses 162, 114, 124, 134, 144, for facilitating communication between PIA 150 and PPRs 102-108.

Each LE includes programmable circuits such as the product-term matrix, and registers. For example, every LE can be independently configured to perform sequential and/or combinatorial logic operation(s). It should be noted that the underlying concept of PSD would not change if one or more blocks and/or circuits were added or removed from PSD.

Control units 110, 120, 130, 140, also known as configuration logics, can be a single control unit. Control unit 110, for instance, manages and/or configures individual LE in LAB 118 based on the configuration stored in memory 112. It should be noted that some I/O ports or I/O pins are configurable so that they can be configured as input pins and/or output pins. Some I/O pins are programmed as bi-directional I/O pins while other I/O pins are programmed as unidirectional I/O pins. The control units such as unit 110 is used to handle and/or manage PSD operations in accordance with system clock signals.

LBs 116, 126, 136, 146 are programmable by the end user(s). Depending on the applications, LBs can be configured to perform user specific functions based on a predefined functional library facilitated by configuration software. PSD, in some applications, also includes a set fixed circuits for performing specific functions. For example, PSD can include a portion of semiconductor area for a fixed nonprogrammable processor for enhance computation power.

PIA 150 is coupled to LBs 116, 126, 136, 146 via various internal buses such as buses 114, 124, 134, 144, 162. In some embodiments, buses 114, 124, 134, 144, and 162 are part of PIA 150. Each bus includes channels or wires for transmitting signals. It should be noted that the terms channel, routing channel, wire, bus, connection, and interconnection are referred to the same or similar connections and will be used interchangeably herein. PIA 150 can also be used to receives and/or transmits data directly or indirectly from/to other devices via I/O pins and LAB s.

A function of WCB such as WCB 152 is a special purpose communication unit capable of transmitting or receiving information between WAP and an external remote system via a wireless communication network. A configurable or programmable WCB, in one aspect, is able to be programmed to facilitate wireless communication using a wireless communication, such as, but not limited to, Wi-Fi, Bluetooth, cellular, satellite, and/or radio networks.

An advantage of employing a programmable WCB is to enable PSD to independently communicate with an external system without a host.

Figure 4B:
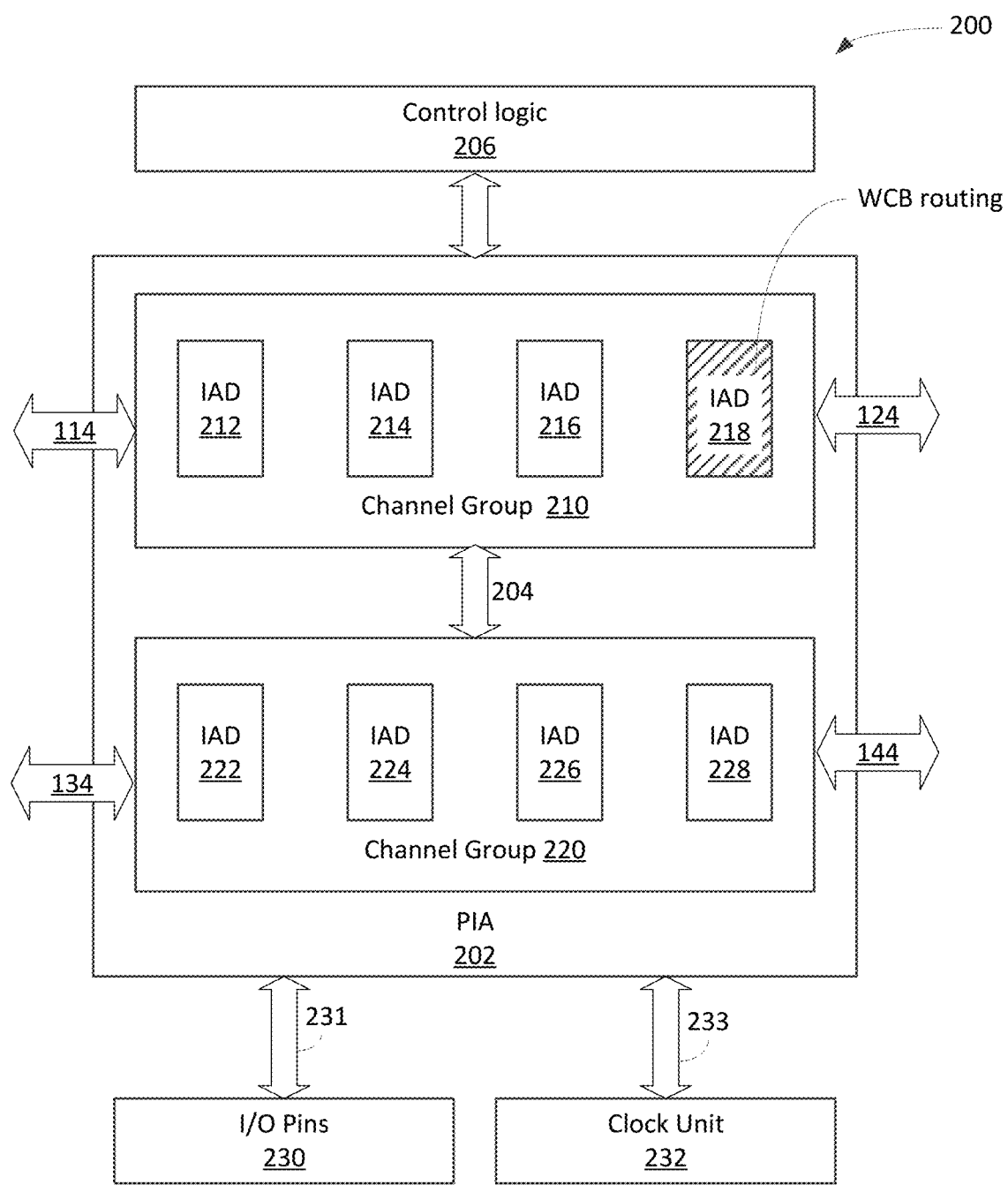

FIG. 4B is a block diagram 200 illustrating a routing logic or fabric containing programmable arrays for facilitating interconnecting various components including WCB routing in accordance with one embodiment of the present invention. Diagram 200 includes control logic 206, PIA 202, I/O pins 230, and clock unit 232. Control logic 206, which may be similar to control units shown in FIG. 4A, provides various control functions including channel assignment, differential I/O standards, and clock management. Control logic 206 may contain volatile memory, non-volatile memory, and/or a combination of volatile and nonvolatile memory device for storing information such as configuration data. In one embodiment, control logic 206 is incorporated into PIA 202. It should be noted that the underlying concept of the exemplary embodiment(s) of the present invention would not change if one or more blocks (circuit or elements) were added to or removed from diagram 200.

I/O pins 230, connected to PIA 202 via a bus 231, contain multiple programmable I/O pins configured to receive and/or transmit signals to external devices. Each programmable I/O pin, for instance, can be configured to input, output, and/or bi-directional pin. Depending on the applications, I/O pins 230 may be incorporated into control logic 206.

Clock unit 232, in one example, connected to PIA 202 via a bus 233, receives various clock signals from other components, such as a clock tree circuit or a global clock oscillator. Clock unit 232, in one instance, generates clock signals in response to system clocks as well as reference clocks for implementing I/O communications. Depending on the applications, clock unit 232, for example, provides clock signals to PIA 202 including reference clock(s).

PIA 202, in one aspect, is organized into an array scheme including channel groups 210 and 220, bus 204, and I/O buses 114, 124, 134, 144. Channel groups 210, 220 are used to facilitate routing information between LBs based on PIA configurations. Channel groups can also communicate with each other via internal buses or connections such as bus 204. Channel group 210 further includes interconnect array decoders ("IADs") 212-218. Channel group 220 includes four IADs 222-228. A function of IAD is to provide a configurable routing resources for data transmission.

IAD such as IAD 212 includes routing multiplexers or selectors for routing signals between I/O pins, feedback outputs, and/or LAB inputs to reach their destinations. For example, an IAD can include up to 36 multiplexers which can be laid out in four banks wherein each bank contains nine rows of multiplexers. It should be noted that the number of IADs within each channel group is a function of the number of LEs within the LAB.

PIA 202, in one embodiment, designates a special IAD such as IAD 218 for handling WCB routing. For example, IAD 218 is designated to handle connections and/or routings between WCB and the LAB s to facilitate data transmission using a wireless network. It should be noted that additional IADs may be allocated for handling WCB operations.

An advantage of using IAD 218 within PIA as a designated WCB routing is that it integrates WCB with FPGA to provide network communication using a detected nearby wireless communications network.

Figure 5A:
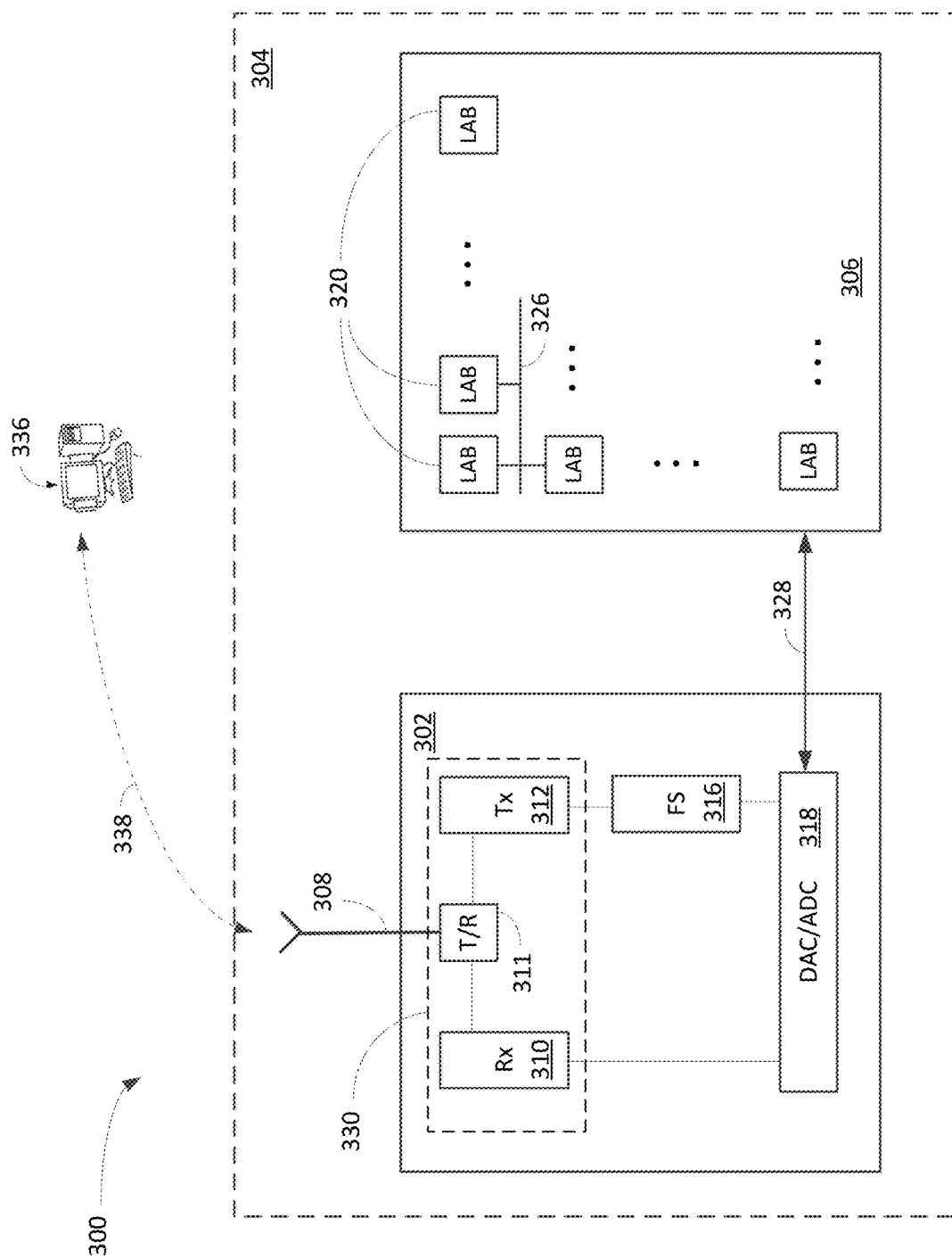
FIGS. 5A-5B are block diagrams illustrating an integrated circuit ("IC") containing a programmable logic circuit ("PLC") and a programmable WCB in accordance with one embodiment of the present invention.

FIG. 5A is a block diagram 300 illustrating an IC 304 containing a programmable logic circuit ("PLC") 306 and a programmable WCB 302 in accordance with one embodiment of the present invention. IC 304, also known as semiconductor chip or semiconductor die, is a WAP including a wireless communication circuitry such as a configurable WCB 302 and PLC 306 which is capable of performing programmable logical functions such as FPGA and PLD. Diagram 300 further includes an antenna 308 which can either be an independent apparatus or a fabricated component in IC 304. It should be noted that the underlying concept of the exemplary embodiment(s) of the present invention would not change if one or more blocks (circuit or elements) were added to or removed from diagram 300.

PLC 306, in one example, contains a set of LABs or LBs 320 organized in array configuration with multiple configurable blocks. LABs or LBs 320 can be further organized in rows and columns of programmable LEs or macrocells, not shown in FIG. 3A, for performing programmed logic functions. To provide user selectable or programmable logic functions, one or more LABs 320 are usually required to deliver the selected functions. To group multiple LABs 320 to perform a user selected function, a programmable routing fabric 326 is employed to interconnect one or more LAB s 320. It should be noted that each of the configurable LEs, LBs, and/or LABS can be selectively programmed to perform one or more logic functions.

Routing fabric 326, in one example, is an array of configurable connections for selectively connecting one or more LABs for routing and processing data between LABs 320. Another function of routing fabric 326 is to route data or information between LAB s 320 and input/output ports of PLC 306. In one aspect, at least a portion of routing fabric 326 can be configured to supply or terminate power supply to or from at least a portion of LAB s 320 in accordance with power control signals generated by WCB 302.

WCB 302, in one aspect, is a configurable or programmable communication circuit capable of receiving or transmitting information between IC 304 and an external system 336 via a wireless network 338. WCB 302 includes a transmitter and receiver ("T/R") switch 311, receiver 310, transmitter 312, frequency synthesizer 316, and converter 318. In one embodiment, WCB 302 further includes a control circuit, a processor, or a controller configured to assist managing various components, such as receiver 310, T/R switch 311, transmitter 312, frequency synthesizer 316, and/or converter 318. In an alternative embodiment, receiver 310 and transmitter 312 are combined into one or more built-in transceiver as indicated by numeral 330 capable of handling wireless communication via a selected wireless protocol. It should be noted that WCB 302 may include additional components such as memory and power supply.

Transmitter 312, also known a radio transmitter, is an electronic telecommunication device capable of generating radio waves or frequencies representing digital information which is subsequently transmitted via an antenna 308. For example, the radio frequency or waves can be transmitted to their remote destinations such as system 336. The information or data is fed from a frequency synthesizer ("FS") 316.

Receiver 310, also known as a radio receiver, is an electronic telecommunication device capable of receiving radio waves or frequency from an antenna such as antenna 308. Antenna 308, for example, receives radio waves or frequency and forward the received waves or frequency to receiver 310 which subsequently sends the received waves to converter 318 for conversion, modulation, and processing. It should be noted that transmitter/receiver switch 311 is used to schedule whether receiver 310 or transmitter 312 can use antenna 308. In one aspect, switch 311 is controlled or managed by a controller or control circuit in IC 304.

FS 316 is a frequency generator capable of producing multiple frequencies from a reference frequency. For example, FS 316 is able to generate a range of frequencies for various wireless communication protocols. For instance, FS 316 can generate frequencies for Wi-Fi, Bluetooth, radio, satellite, and/or cellular wireless network. In one example, FS 316 includes sub-components such as frequency multiplication, frequency division, frequency mixing, and phase-locked loops to generate intended frequency(s).

Converter 318, in one embodiment, is a digital-to-analog ("DAC") and/or analog-to-digital ("ADC") converter. Note that DAC is a circuit able to convert a digital signal to an analog signal. Similarly, ADC is a conversion circuit configured to convert analog signal into digital signal. In one aspect, the output of convert 318 is fed to the processor or PLC 306 as indicated by numeral 328.

In one embodiment, a built-in transceiver or transceiver 330 is used in place of transmitter and receiver. For example, a built-in transceiver 330 includes one or more receivers as indicated by numeral 310, transmitters as indicated by numeral 312, and transmitter/receiver switches as indicated by numeral 311. A function of transceiver is to transmit and receive information. A wireless transceiver is commonly used in a portable device, such as a cellular phone, Wi-Fi modem, cordless telephone, satellite modem, radio based two-way walkie-talkie, Bluetooth device, and the like.

In one aspect, transceiver 330 is configurable to provide various transceiver functions with different wireless communication protocols. For example, transceiver 330 may include a Wi-Fi transmitter and a Wi-Fi receiver. Alternatively, transceiver 330 includes a Bluetooth transmitter and a Bluetooth receiver. Transceiver 330 can also include a cellular transmitter and a cellular receiver depending on applications. Transceiver 330, in one aspect, includes a selectable Wi-Fi transceiver, selectable Bluetooth transceiver, and/or cellular transceiver wherein transceiver 330 is capable of selecting one of the built-in (Wi-Fi, Bluetooth, cellular, etc.) transceivers to handle a selected wireless communication via a wireless network.

IC 304, in one aspect, includes a processor or controller, not shown in FIG. 3A, wherein the processor can be an independent circuit or a part of WCB 302. Alternatively, the processor can be a part of PLC 306. The processor, for example, can be a control circuit configured to selectively activate at least a portion of the LAB s based on, for instance, a wake-up signal received by built-in transceiver 330 via a wireless communications network. Similarly, the processor, controller, or control circuit can be configured to selectively place at least a portion of the LABs into a sleep mode for power conservation in response to, for example, a sleep signal received by built-in transceiver 330 through the wireless communications network.

The processor or control circuit, in one aspect, is configured to manage power distribution to at least a portion of the LABs in response to a power signal received by built-in transceiver 330 via the wireless communications network. In another aspect, the processor is able to retrieve data from PLC 306 in accordance with the data request received by transceiver 330 and transmit the retrieved data to the user who requested the data such as system 336 via WCB 302 through wireless communications network 338.

It should be noted that IC 304 can be used or employed any systems, such as, but not limited to, portable devices, monitoring systems, automobiles, airplanes, ships, autonomous vehicles, drones, security apparatus, and the like. An advantage of using WCB 302 is that it facilitates communication between IC 304 and a remote external system via a wireless communications network.

Figure 5B:
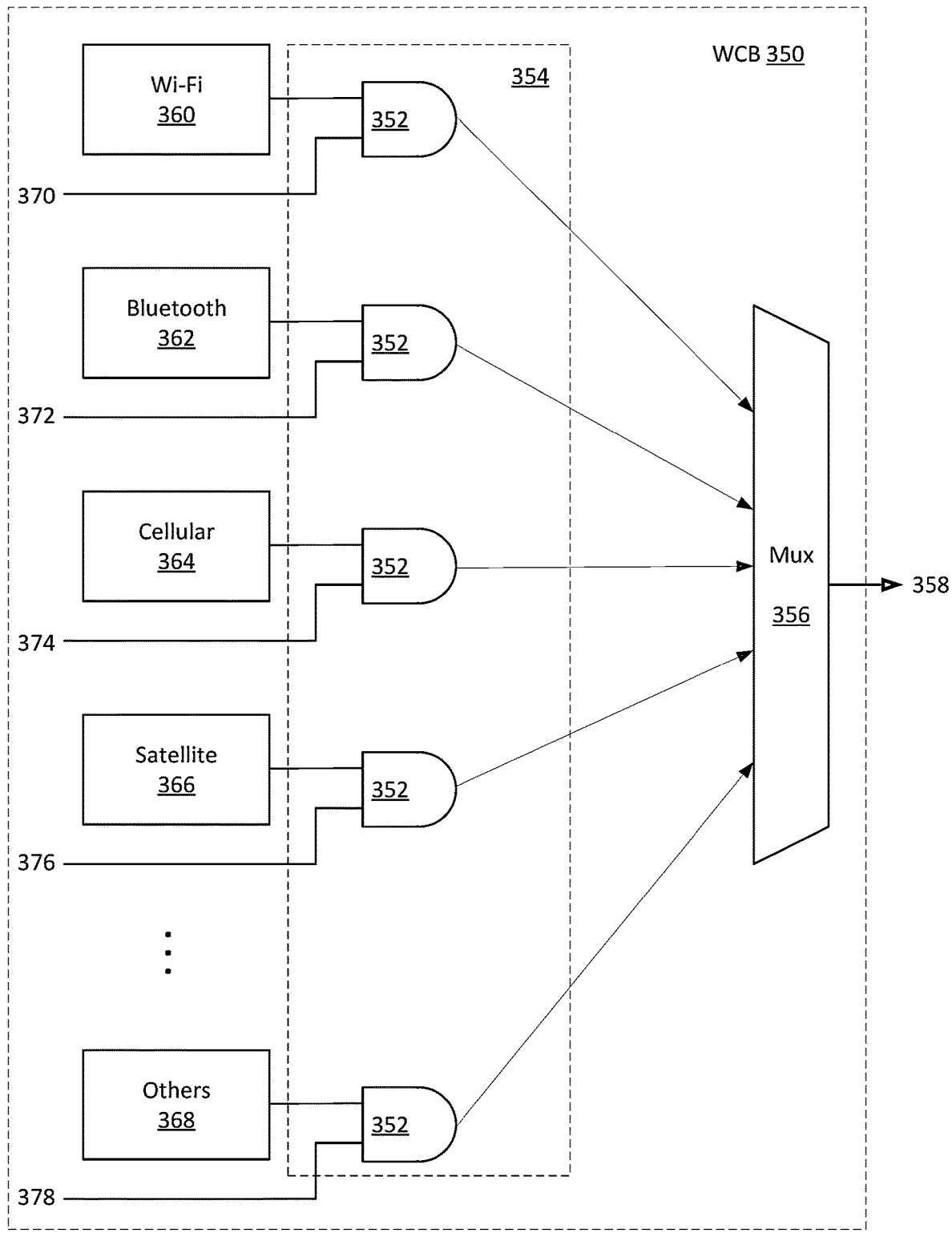

FIG. 5B is a block diagram illustrating a WCB 350 containing multiple programmable wireless communication circuits ("WCCs") 360-368 in accordance with one embodiment of the present invention. WCB 350 includes a Wi-Fi WCC 360, Bluetooth WCC 362, cellular WCC 364, satellite WCC 366, WCC selector 354, and mux 356. In one aspect, WCB 350, similar to WCB 302 shown in FIG. 3A, can be programmed to one of predefined wireless protocols. In another aspect, WCB 350 can be programmed to handle more than one wireless communication networks. For example, WCB 350 can facilitate Bluetooth communication for authentication while using Wi-Fi communication for data transmission. It should be noted that the underlying concept of the exemplary embodiment(s) of the present invention would not change if one or more blocks (circuit or elements) were added to or removed from WCB 350.

Wi-Fi WCC 360, in one embodiment, includes a Wi-Fi transceiver, FS, and a converter configured to handle communication using Wi-Fi protocol via a Wi-Fi communications network. Wi-Fi is a radio technology used for wireless local area networking (WLAN) of devices based on IEEE 802.11 standards. It should be noted that Wi-Fi systems are able to connect to a Wi-Fi communication network which may further couple to the Internet. Wi-Fi WCC 360, in one aspect, can be activated or deactivated by WCC selector 354.

Bluetooth WCC 362, in one embodiment, includes a Bluetooth transceiver, FS, and a converter configured to handle communication using Bluetooth protocol via a Bluetooth communications network. Bluetooth which is based on IEEE 802.15.1 standards is a wireless network for facilitating communication between fixed as well as mobile devices. Bluetooth technology generally provides wireless communication over short distances using short-wavelength UHF (ultra high frequency) radio waves ranging from 2.400 to 2.485 GHz. Bluetooth can also be categorized as personal area networks (PANs). Bluetooth WCC 362, in one aspect, can be activated or deactivated by WCC selector 354.

Cellular WCC 364, in one embodiment, includes a cellular transceiver, FS, and a converter configured to handle communication using one or more cellular protocol via a cellular communications network or cellular network. The cellular communications network, which is also known as a mobile network, is considered as a communications network wherein some of the links are wireless connections or the last portion of connection. It should be noted that cellular network is organized in cells and base stations wherein the base stations provide one or more cells with network transmission coverage. The cellular network uses various wireless frequency bands, such as, but not limited to, GSM (global system for mobile), UMTS (Universal Mobile Telecommunications Service or 3G), LTE (long-term evolution or 4G), 5G (fifth generation), and the like. Cellular WCC 364, in one aspect, can be activated or deactivated by WCC selector 354.

Satellite WCC 366, in one embodiment, includes a satellite transceiver, FS, and a converter configured to handle communication using one or more satellite communication protocol via a satellite network. A satellite network, also known as satellite Internet, provides network communication using various communication satellites in orbits. The satellites also known as geostationary satellites, in one example, use K band(s) to provide data transmission with a speed up to 800 megabits per second. Satellite WCC 366, in one aspect, can be activated or deactivated by WCC selector 354.

Other WCC such as WCC 368 may be selected for other types of wireless communications. For example, a specific defined radio frequency may be used to communicate with external system(s). For example, a special radio frequency may be used to provide security access for preventing unauthorized access to WAP. It should be noted that FS s and converters described in Wi-Fi WCC 360, Bluetooth WCC 362, cellular WCC 364, and/or satellite WCC 366 may be combined or partially combined to simplify the design of programmable WCB.

WCC selector 354, in one aspect, is configured to optionally select one or more WCCs for facilitating wireless communications. In one example, WCC selector 354 includes various programmable elements 352 and is capable of select or activate any of WCCs 360-368 in response to control signals 370-378. In an alternative embodiment, programmable elements 352 can be nonvolatile memories which store programmable information based on the configuration program for controlling WCCs 360-368.

Mux 356 is a multiplexer or any other merging component capable of gating output 358 in response to inputs from WCCs 360-68. In one embodiment, mux 356 is organized into several sub-multiplexers to facilitate activating more than one WCC.

An advantage of using a programmable WCB is that it provides a configurable capability of using nearby wireless networks for facilitating network communication between WAP and a remote system.

Figure 6A:
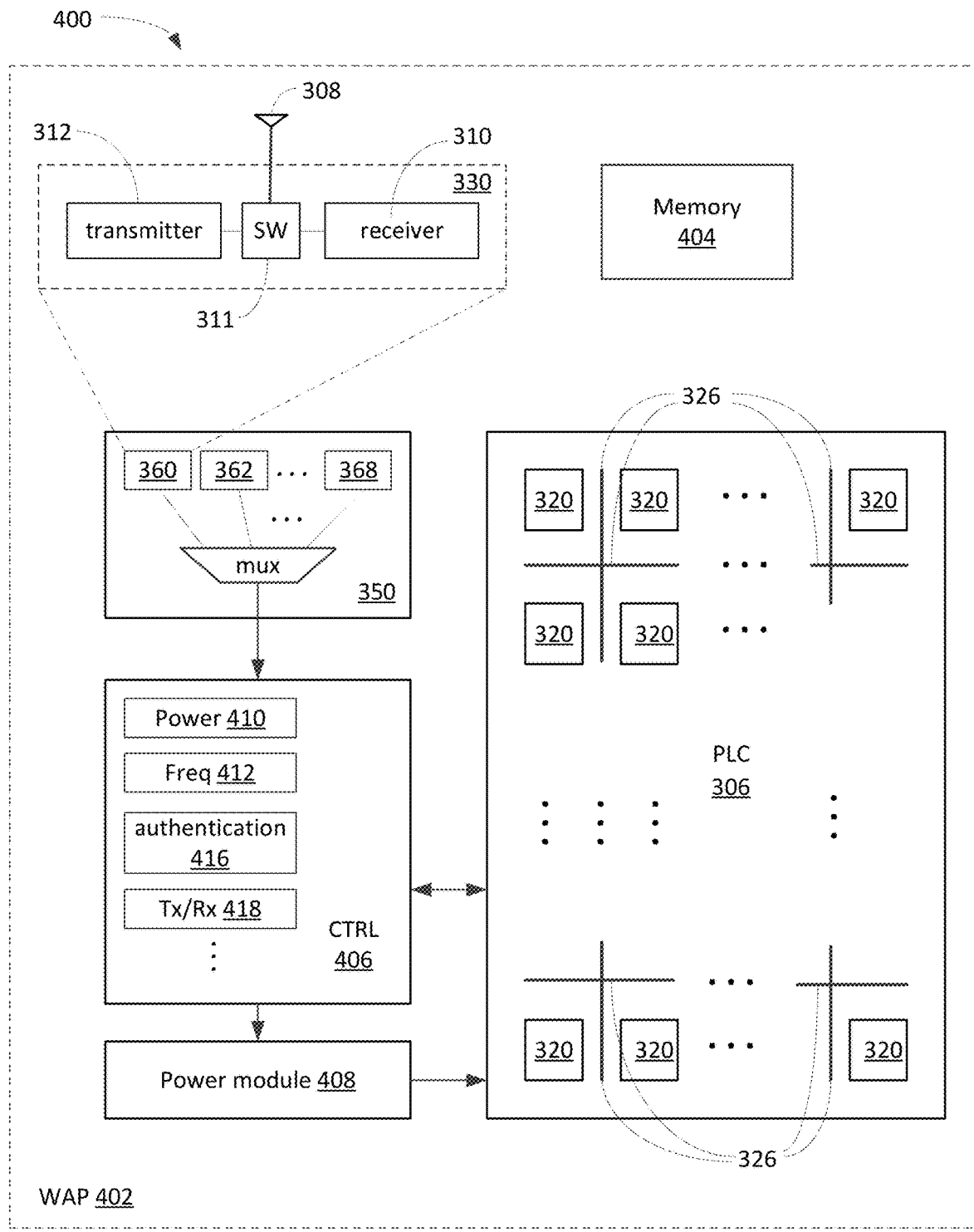
FIGS. 6A-6B are block diagrams illustrating an apparatus containing FPGA and WCB in accordance with one embodiment of the present invention.

FIG. 6A is a block diagram 400 illustrating a WAP fabricated in an IC capable of facilitating wireless communication between PLD and a remote system in accordance with one embodiment of the present invention. WAP 404, in one embodiment, includes a PLC 306, WCB 350, controller 406, memory 404, and power module 408 in accordance with one embodiment of the present invention. Memory 404 is used to store information such as configuration information. It should be noted that the underlying concept of the exemplary embodiment(s) of the present invention would not change if one or more blocks (circuit or elements) were added to or removed from diagram 400.

WCB 350, which is the same or similar to WCB illustrated in FIG. 5B, includes multiple WCCs 360-368, such as Wi-Fi WCC, Bluetooth WCC, cellular WCC, satellite WCC, WCC selector, and mux. Each WCC such as WCC 360 includes a transceiver 330 containing a transmitter 312, receiver 310, switch 311, and antenna 308. In one example, antenna 308 can be shared by WCCs 360-368. In one aspect, WCB 350 is programmed to handle one or more wireless networks concurrently. For example, Bluetooth may be activated for WAP 402 authentication while Wi-Fi communication is activated for transmitting information between WAP 402 and an external system.

PLC 306, which is the same or similar to PLC illustrated in FIG. 5A, includes a set of LAB s 320 connected by configurable routing fabric 326. PLC 306 provides various predefined logic functions based on user selections. In one aspect, PLC 306, WCB 350, and controller 406 are deposited or fabricated on a single IC or die.

Controller 406 is a digital processing unit capable of executing instructions configured to provide various functions including power function 410, frequency function 412, authentication function 416, and transceiver function 418. Power function 410, in one aspect, is able to generate power control signals to place at least a portion of PLC 306 in low-power or sleeping mode for power conservation. Similarly, power function 410 is able to wake or activate at least a portion of PLC 306 from low-power mode based on a set of predefined conditions. The output of power function 410, in one example, is fed to power module 408 which will be used to gate power supplies to at least a portion of PLC 306.

Frequency function 412, in one embodiment, is used to identify what type of wireless network or networks WCB 350 should be programmed or configured. In one aspect, frequency function 412 can dynamically instruct WCB 350 to reprogram for handling different types of wireless networks. For example, if WAP 402 is situated in a moving object such as cars or airplanes, WAP 402 may have to be dynamically reconfigured based on the availability of wireless networks. For instance, while the cellular coverage in some location is absent, the coverage of satellite network may be sufficient. In addition, frequency function 412 can facilitate network bonding to enhance network efficiency.

Authentication function 416 is used to secure the access of WAP 402. In one embodiment, a unique wireless communication key using, for instance, Bluetooth is used to substantiate the authenticity of the requester or user of requesting access to WAP 402. It should be noted that using one wireless communication (e.g., cellular) for authentication and using another wireless communication (e.g., Wi-Fi) for data transfer can improve the security of WAP access.

Transceiver function 418, in one aspect, is to manage activities of transmitter and receiver. Depending on the applications, some WAPs may not require a receiver because it does not need to receive any information. For example, a security monitor capturing images may not need a receiver since it does not require to receive any instruction. Similarly, some WAPs may not require a transmitter because it does not require to transmit any information.

An advantage of using a WAP is that it allows a user or subscriber to access WAP without going through a host computer.

Figure 6B:
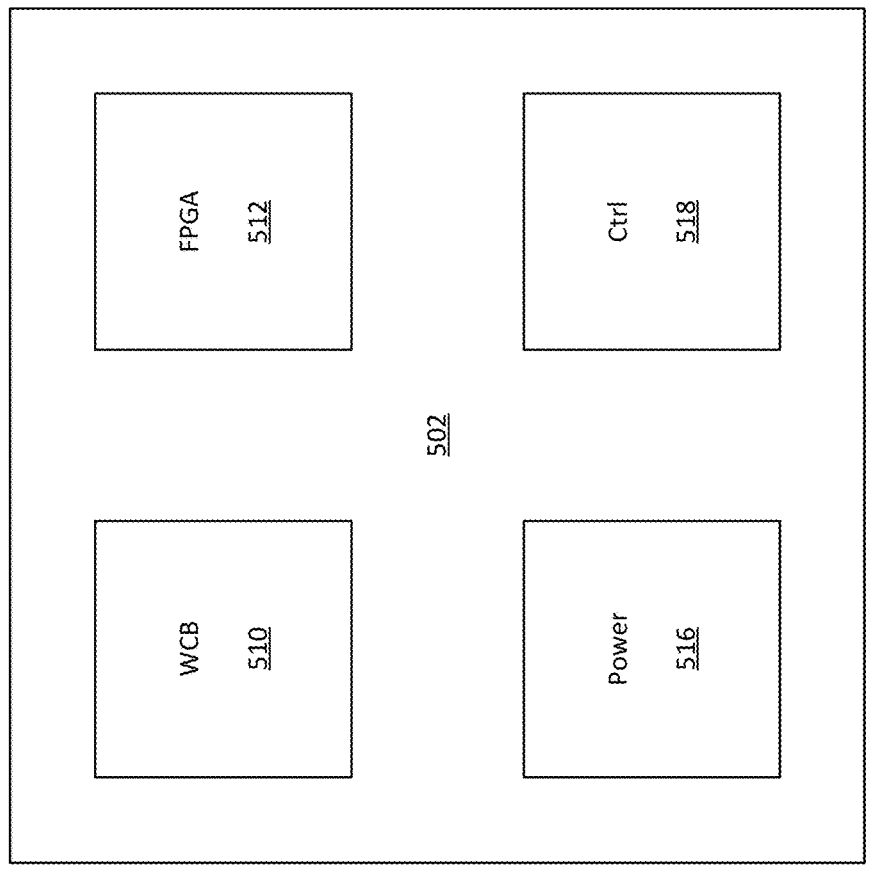

FIG. 6B is a block diagram 500 illustrating a module 502 containing multiple ICs including programmable chip and built-in communication chip in accordance with one embodiment of the present invention. Module 502, in one example, is a multi-chip module ("MCM") capable of housing multiple ICs or chips. Module is an electronic assembly containing conductive terminals (or pins) and a substrate. In one aspect, an MCM is capable of housing multiple ICs, chips, semiconductor dies, or any other components that can be integrated or attached to a substrate. Module 502, in one aspect, includes a WCB 510, FPGA 512, power 516, and controller 518. It should be noted that the underlying concept of the exemplary embodiment(s) of the present invention would not change if one or more blocks (chips or elements) were added to or removed from diagram 500.

Module 502, in one embodiment, includes a first IC, a second IC, and a substrate capable of providing a wireless accessible logic device. The substrate is configured to provide interconnections for mounted ICs as well as input/output terminals. The first IC, in one aspect, is placed over the substrate and containing an array of configurable LBs and a routing fabric. The configurable LB can be selectively programmed to perform one or more logic functions. In one example, the first IC is FPGA 512. The second IC, which is placed or mounted over the substrate, is a configurable WCB 510. In one aspect, WCB 510 includes a control circuit and a built-in transceiver for facilitating transmitting information between module 502 and an external system via a wireless communications network. It should be noted that the built-in transceiver includes a selectable Wi-Fi transceiver and a selectable Bluetooth transceiver.

Controller 518, in one aspect, is configured to select one of the selectable Wi-Fi and Bluetooth transceivers. Controller 518, in one embodiment, is also configured to provide other functions, such as, but not limited to, power management, system activation, wireless communication protocols, authentications, and the like. Controller 518 can also be integrated into WCB 510 or FPGA 512.

Power 516, in one embodiment, is used to manage power consumption of the module. For example, if the module is not active, a portion of the module such as FPGA is placed in a sleep mode. Power 516 can also be an independent power supply including, but not limited to, battery, solar power, power storage, municipal power receptor, and the like.

An advantage of using a module containing multiple ICs including WCB is that it allows a user or subscriber to access FPGA without going through a host computer.

The exemplary embodiment of the present invention includes various processing steps, which will be described below. The steps of the embodiment may be embodied in machine or computer executable instructions. The instructions can be used to cause a general purpose or special purpose system, which is programmed with the instructions, to perform the steps of the exemplary embodiment of the present invention. Alternatively, the steps of the exemplary embodiment of the present invention may be performed by specific hardware components that contain hard-wired logic for performing the steps, or by any combination of programmed computer components and custom hardware components.

Figure 7A:
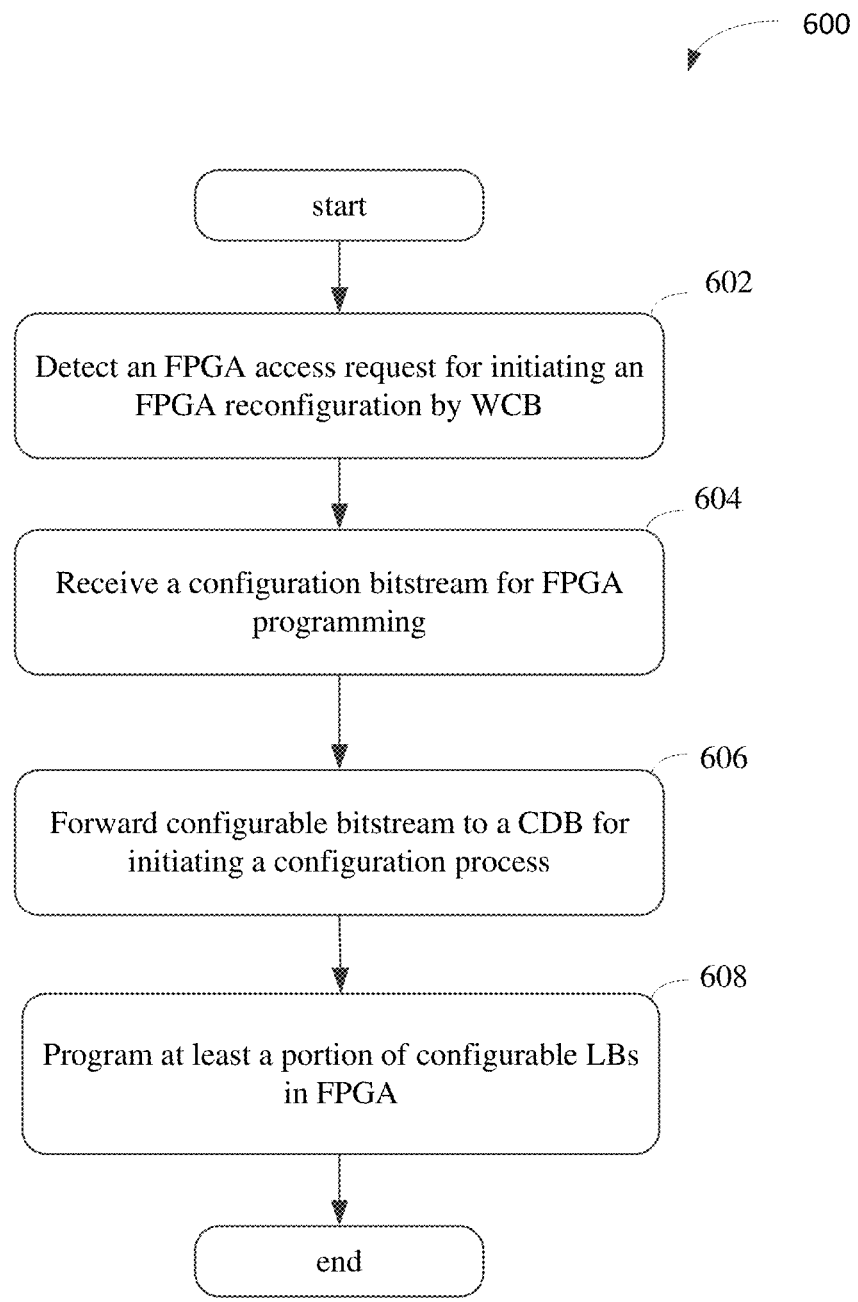
FIGS. 7A-7B are flowcharts illustrating a process of implementation of WAP for wireless downing of configuration bitstream in accordance with one embodiment of the present invention.

FIG. 7A is a flowchart illustrating a process of wireless programming an FPGA via a WCB in accordance with one embodiment of the present invention. At block 602, the process of WCB is able to detect an FPGA access request for initiating an FPGA reconfiguration from a remote system via a wireless communications network. In one example, the wireless communications network is a Wi-Fi network wherein a Wi-Fi signal is received by a built-in Wi-Fi transceiver in the WCB.

At block 604, WCB receives a configuration bitstream for FPGA programming from the remote system via the wireless communications network. In one aspect, WCB is configured to wake up at least some of the LBs by a wake-up signal initiated by a control circuit in the WCB in accordance with the configuration bitstream. The configuration bitstream is processed by the CDB in accordance with the FPGA access request.

At block 606, the configuration bitstream is forwarded to a CDB for initiating a configuration process. In one example, the configuration bitstream formatted in a wireless protocol is converted to an executable netlist.

At block 608, the CDB is configured to program or map at least a portion of configurable LBs in the FPGA based on the configuration bitstream. In one embodiment, a gate-level netlist based on a synthesized filed is identified in accordance with the configuration bitstream. The gate-level netlist is subsequently mapped into the FPGA during the configuration process. The process is capable of verifying and debugging the programmed FPGA logic by the CDB in accordance with the gate-level netlist. After editing and compiling the configuration bitstream by a user device or the remote system, WCB is capable of authenticating the remote system for wirelessly transmitting the configuration bitstream. In one example, a Wi-Fi transceiver from the WCB is selected in response to a wireless control signal for receiving the configuration bitstream. The process is able to select the Bluetooth transceiver, Wi-Fi transceiver, cellular transceiver, or satellite transceiver in the WCB based on a wireless control signal for obtaining the configuration bitstream.

Figure 7B:
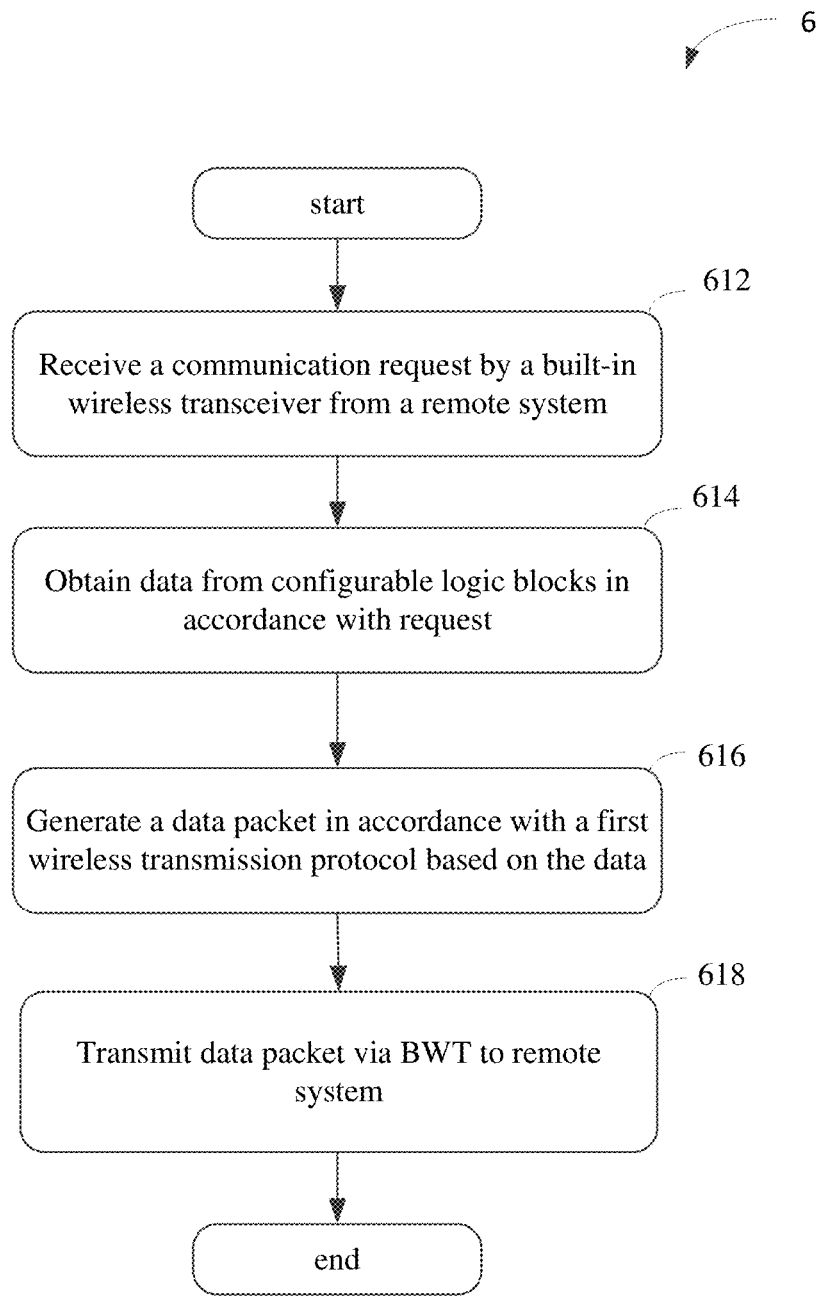

FIG. 7B is a flowchart 601 illustrating a process of WAP in accordance with one embodiment of the present invention. At block 612, a process of FPGA containing a programmable WCB receives a communication request by a built-in wireless transceiver ("BWT") from a remote system via a wireless communications network. For example, the communication request is received through a Wi-Fi signal by a built-in Wi-Fi transceiver over a Wi-Fi network.

At block 614, the data from the configurable LBs is obtained in accordance with the communication request via a routing fabric. For example, after waking up at least some of the LBs by a control circuit in WCB in response to the communication request, the data is processed by the LBs according to the communication request.

At block 616, a data packet is generated in accordance with the first wireless transmission protocol based on the data. For example, a data stream is composed in a predefined Wi-Fi protocol by a built-in Wi-Fi transmitter.

At block 618, the process is capable of transmitting the data packet to the remote system via the BWT through the wireless communications network. For instance, the data stream is transmitted to the remote system via a Wi-Fi communications network. In one embodiment, a Wi-Fi transceiver is selected in WCB in response to a wireless control signal. Alternatively, Bluetooth transceiver, Wi-Fi transceiver, cellular transceiver, or satellite transceiver can be selected according to a wireless control signal.

In another embodiment, WCB in FPGA can be configured to provide power management for reducing power consumption. For instance, the WCB can be configured to be on or active all the time while shutting down FPGA portion of logic for power conservation. The WCB, for example, can wake up FPGA portion of the logic when the data transmission happens.

A power management process for an FPGA with a programmable WCB, in one aspect, is capable of maintaining a BWT in an active mode while placing the LB in the FPGA in a sleep mode for power conservation. For example, while allowing the power to continuously supplying to BTW, the power supply to the LBs is shut off or halted. Upon receiving an access request by the BWT from a remote system via a wireless communications network, the LBs of FPGA is activated or woken up from the sleep mode by the BWT in response to the access request. The data subsequently can be retrieved from the portion of LB based via routing fabric on the access request. After generating a data packet formatted in a wireless protocol, the data packet is transmitted by BWT to the remote system via the wireless communications network.

Figure 8A:
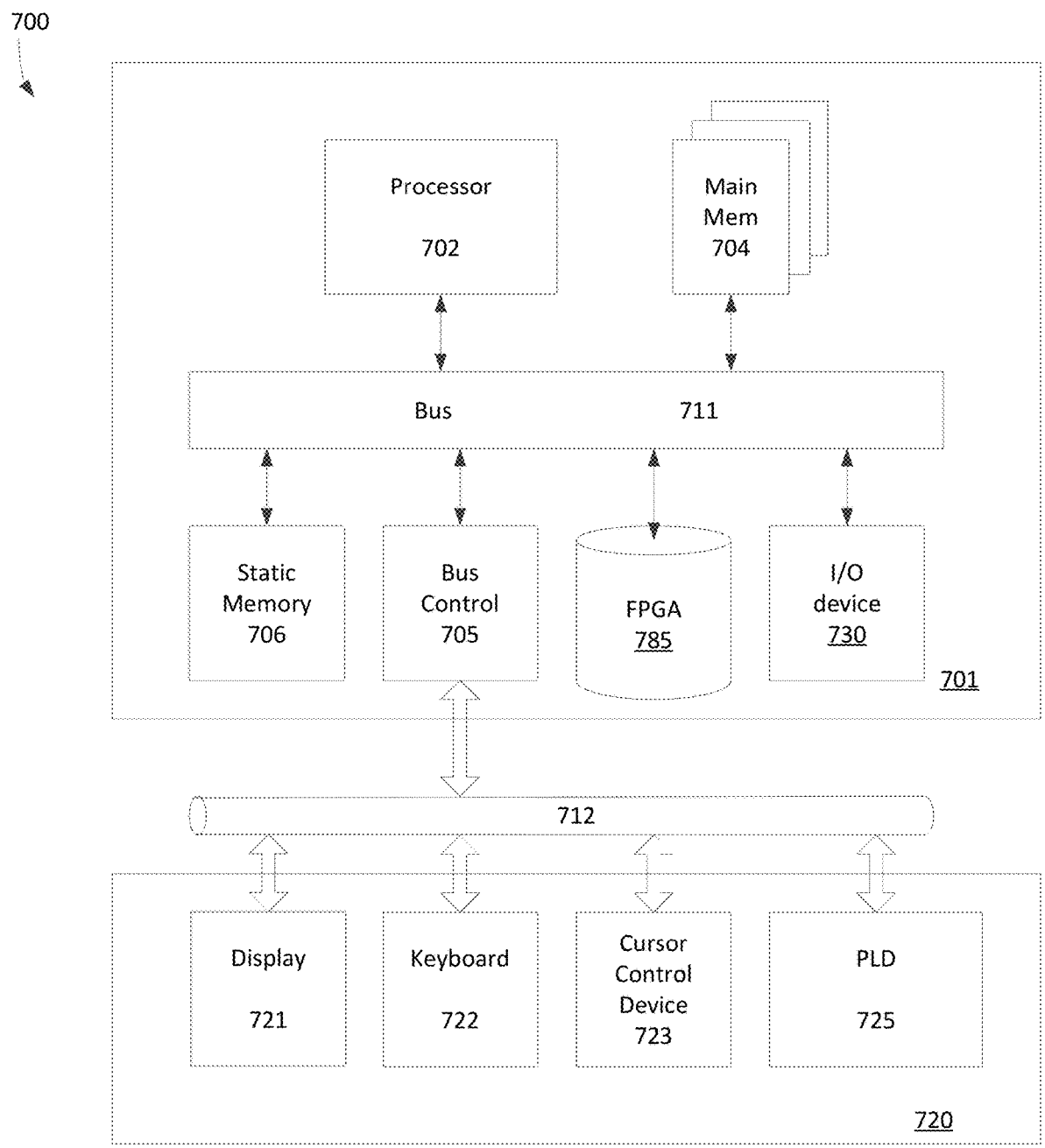
FIGS. 8A-8B are diagrams illustrating a system and cloud-based system environment using one or more WAPs having WCB(s) in accordance with one embodiment of the present invention.

FIG. 8A is a diagram 700 illustrating a system or computer using one or more WAPs having WCB(s) in accordance with one embodiment of the present invention. Computer system 700 includes a processing unit 701, an interface bus 712, and an input/output ("IO") unit 720. Processing unit 701 includes a processor 702, main memory 704, system bus 711, static memory device 706, bus control unit 705, I/O element 730, and FPGA 785. It should be noted that the underlying concept of the exemplary embodiment(s) of the present invention would not change if one or more blocks (circuit or elements) were added to or removed from FIG. 8A.

Bus 711 is used to transmit information between various components and processor 702 for data processing. Processor 702 may be any of a wide variety of general-purpose processors, embedded processors, or microprocessors such as ARM® embedded processors, Intel® Core™ Duo, Core™ Quad, Xeon®, Pentium™ microprocessor, Motorola™ 68040, AMD® family processors, or Power PC™ microprocessor.

Main memory 704, which may include multiple levels of cache memories, stores frequently used data and instructions. Main memory 704 may be RAM (random access memory), MRAM (magnetic RAM), or flash memory. Static memory 706 may be a ROM (read-only memory), which is coupled to bus 711, for storing static information and/or instructions. Bus control unit 705 is coupled to buses 711-712 and controls which component, such as main memory 704 or processor 702, can use the bus. Bus control unit 705 manages the communications between bus 711 and bus 712. Mass storage memory or SSD which may be a magnetic disk, an optical disk, hard disk drive, floppy disk, CD-ROM, and/or flash memories are used for storing large amounts of data.

I/O unit 720, in one embodiment, includes a display 721, keyboard 722, cursor control device 723, and low-power PLD 725. Display device 721 may be a liquid crystal device, cathode ray tube ("CRT"), touch-screen display, or other suitable display device. Display 721 projects or displays images of a graphical planning board. Keyboard 722 may be a conventional alphanumeric input device for communicating information between computer system 700 and computer operator(s). Another type of user input device is cursor control device 723, such as a conventional mouse, touch mouse, trackball, or other type of cursor for communicating information between system 700 and user(s).

PLD 725 is coupled to bus 712 for providing configurable logic functions to local as well as remote computers or servers through wide-area network. PLD 725 and/or FPGA 785 includes one or more WCBs for facilitating wireless access. In one example, PLD 725 may be used in a modem or a network interface device for facilitating communication between computer 700 and the network. Computer system 700 may be coupled to a number of servers via a network infrastructure as illustrated in the following discussion.

Figure 8B:
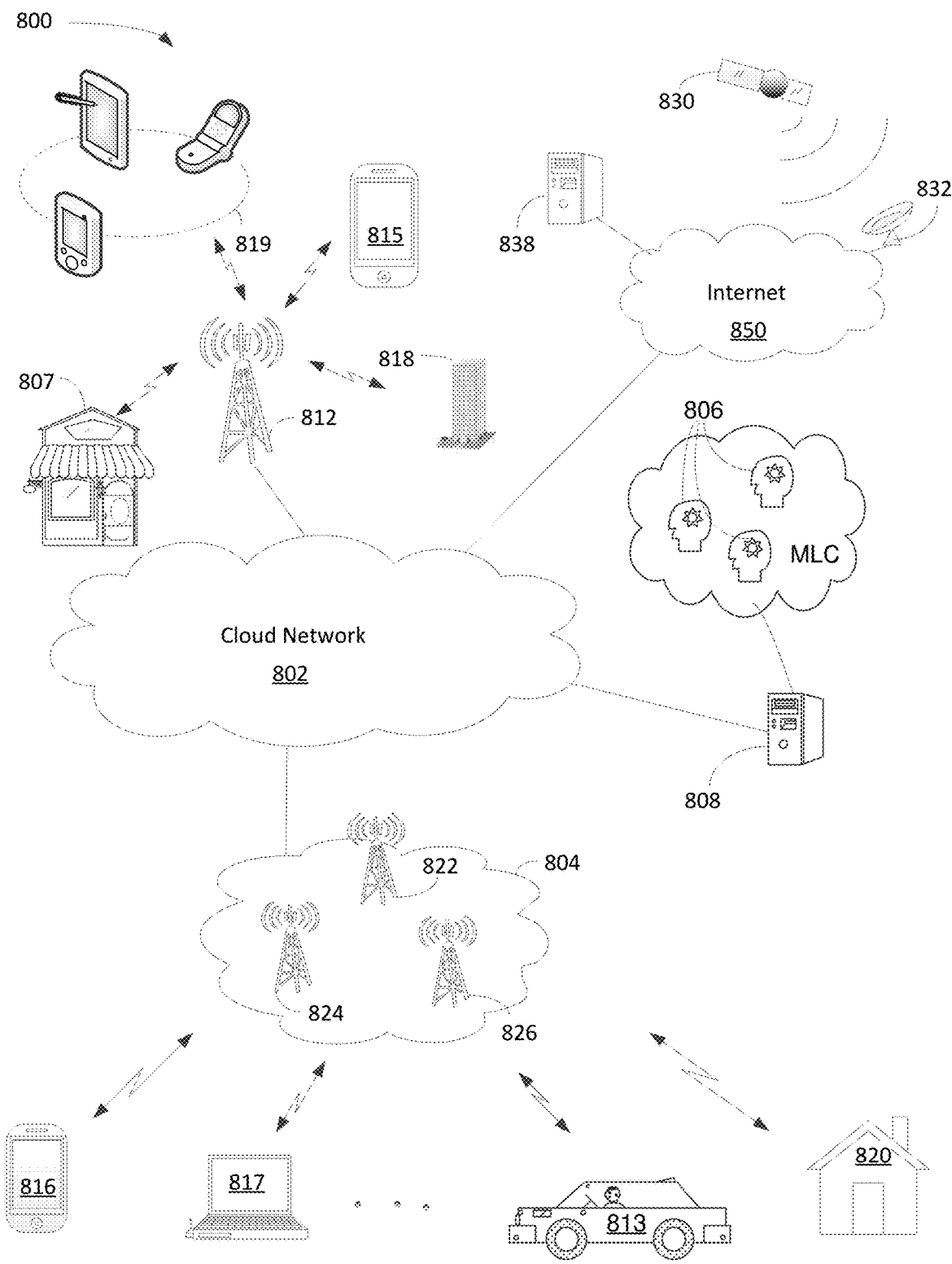

FIG. 8B is a block diagram 800 illustrating various applications of WAP or PSD FPGA and WCBs that can be used in a cloud-based environment in accordance with one embodiment of the present invention. Diagram 800 illustrates AI server 808, communication network 802, switching network 804, Internet 850, and portable electric devices 813-819. In one aspect, PSD or WAP having various WCBs can be used in AI server, portable electric devices, and/or switching network. Network or cloud network 802 can be wide area network ("WAN"), metropolitan area network ("MAN"), local area network ("LAN"), satellite/terrestrial network, or a combination of WAN, MAN, and LAN. It should be noted that the underlying concept of the exemplary embodiment(s) of the present invention would not change if one or more blocks (or networks) were added to or removed from diagram 800.

Network 802 includes multiple network nodes, not shown in FIG. 8B, wherein each node may include mobility management entity ("MME"), radio network controller ("RNC"), serving gateway ("S-GW"), packet data network gateway ("P-GW"), or Home Agent to provide various network functions. Network 802 is coupled to Internet 850, AI server 808, base station 812, and switching network 804. Server 808, in one embodiment, includes machine learning computers ("MLC") 806.

Switching network 804, which can be referred to as packet core network, includes cell sites 822-826 capable of providing radio access communication, such as 3G ($3^{rd}$ generation), 4G, or 5G cellular networks. Switching network 804, in one example, includes IP and/or Multiprotocol Label Switching ("MPLS") based network capable of operating at a layer of Open Systems Interconnection Basic Reference Model ("OSI model") for information transfer between clients and network servers. In one embodiment, switching network 804 is logically coupling multiple users and/or mobiles 816-820 across a geographic area via cellular and/or wireless networks. It should be noted that the geographic area may refer to a campus, city, metropolitan area, country, continent, or the like.

Base station 812, also known as cell site, node B, or eNodeB, includes a radio tower capable of coupling to various user equipments ("UEs") and/or electrical user equipments ("EUEs"). The term UEs and EUEs are referring to the similar portable devices and they can be used interchangeably. For example, UEs or PEDs can be cellular phone 815, laptop computer 817, iPhone ° 816, tablets and/or iPad ° 819 via wireless communications. Handheld device can also be a smartphone, such as iPhone®, BlackBerry®, Android®, and so on. Base station 812, in one example, facilitates network communication between mobile devices such as portable handheld device 815 or 819 via wired and/or wireless communications networks. It should be noted that base station 812 may include additional radio towers as well as other land switching circuitry.

Internet 850 is a computing network using Transmission Control Protocol/Internet Protocol ("TCP/IP") to provide linkage between geographically separated devices for communication. Internet 850, in one example, couples to supplier server 838 and satellite network 830 via satellite receiver 832. Satellite network 830, in one example, can provide many functions as wireless communication as well as global positioning system ("GPS"). It should be noted that WAP can be applied to many fields, such as, but not limited to, smartphones 815-816, satellite network 830, automobiles 813, AI server 808, business 807, and homes 820.

While particular embodiments of the present invention have been shown and described, it will be obvious to those of ordinary skills in the art that based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. A computer network configured to provide information processing and transmission comprising:
   a wireless network able to provide communication between devices via radio frequencies;
   a digital processing device coupled to the wireless network and having a semiconductor die wherein the semiconductor die is designated a first portion of the die containing a field programmable gate array ("FPGA") performing user defined logic functions, a second portion of the die including a configurable wireless communication block ("WCB") containing a built-in wireless transceiver, and a third portion of the die containing a configuration download block ("CDB") for initiating a configuration process, wherein the FPGA includes multiple configurable logic blocks ("LBs") for being selectively programmable to perform user defined logic functions and a routing fabric configured to selectively route information between the configurable LBs and input/output ports based on routing configuration signals; and
   a portable device coupled to the wireless network and configured to download data from the FPGA via the built-in wireless transceiver of the configurable WCB through the wireless network.

2. The computer network of claim 1, wherein the wireless network is a Wi-Fi communication network.

3. The computer network of claim 1, wherein the wireless network is a Bluetooth communication network.

4. The computer network of claim 1, wherein the wireless network is a cellular communication network.

5. The computer network of claim 1, wherein the configurable WCB is programmable to facilitate transmitting information between the configurable LBs and the portable device via the wireless network.

6. The computer network of claim 1, wherein the configurable WCB is programmable to utilize one of Wi-Fi, Bluetooth, and cellular communication protocols for facilitating communication between the FPGA and the portable device.

7. The computer network of claim 1, wherein the portable device is a smart phone.

8. The computer network of claim 1, wherein the portable device is a portable computer.

9. A system network configured to provide information processing and transmission comprising:
   a wireless network able to provide communication between devices via radio frequencies;

a digital processing device coupled to the wireless network and having a semiconductor die wherein the semiconductor die is designated a first portion of the die containing a field programmable gate array ("FPGA") for performing user defined logic function, a second portion of the die including a configurable wireless communication block ("WCB") containing a built-in wireless transceiver and a third portion of the die containing a configuration download block ("CDB") for initiating a configuration process, wherein the FPGA includes multiple configurable logic blocks ("LBs") for being selectively programmable to perform user defined logic functions and a routing fabric configured to selectively route information between the configurable LBs and input/output ports based on routing configuration signals; and a portable device coupled to the wireless network and configured to upload configuration data from the portable device to the FPGA via the built-in wireless transceiver of the configurable WCB through the wireless network.

10. The system network of claim 9, wherein the CDB is configured to program at least a portion of the FPGA during a configuration mode based on the configuration data received from the wireless network.

11. The system network of claim 9, wherein the wireless network is one of a Wi-Fi communication network, a Bluetooth communication network, and a cellular communication network.

12. The system network of claim 9, wherein the configurable WCB is programmable to facilitate transmitting information between the configurable LBs and the portable device via the wireless network.

13. The system network of claim 9, wherein the configurable WCB is programmable to comply with one of Wi-Fi, Bluetooth, and cellular communication protocols for facilitating communication between the FPGA and the portable device.

14. The system network of claim 9, wherein the portable device is a smart phone.

15. The system network of claim 9, wherein the portable device is a portable computer.

16. The system network of claim 9, wherein the portable device is configured to download data from the FPGA during a data mode via the built-in wireless transceiver of the configurable WCB through the wireless network.

17. A method of wireless accessing a field programmable gate array ("FPGA") die containing a wireless communication block ("WCB") comprising:

initiating a wireless communication request sending from a portable device to a WCB of FPGA die in a digital processing device via a wireless network;

receiving an authentication from the WCB to the portable device granting the wireless communication request after a process of authentication verified by the WCB via the wireless network;

sending a bitstream containing configuration data from the portable device to a configurable download block ("CDB") of FPGA die via the WCB through the wireless network for configuring logic blocks of the FPGA die; and programming multiple configurable logic blocks ("LBs") for performing user defined logic functions and a routing fabric for selectively routing information between the configurable LBs and input/output ports based on routing configuration signals.

18. The method of claim 17, further comprising receiving a stream of data indicating status of the FPGA from the WCB to the portable device.

19. The method of claim 17, wherein initiating a wireless communication request includes sending a request formatted in Wi-Fi protocol forwarding to the WCB via a Wi-Fi communication network.

20. The method of claim 17, wherein initiating a wireless communication request includes sending a request formatted in Bluetooth protocol forwarding to the WCB via a Bluetooth communication network.

21. The method of claim 17, wherein initiating a wireless communication request includes sending a request formatted in fifth generation ("5G") protocol forwarding to the WCB via a 5G communication network.

* * * * *